(12) United States Patent
Lim

(10) Patent No.: US 11,917,311 B2
(45) Date of Patent: Feb. 27, 2024

(54) UNIT PIXEL, IMAGE SENSOR AND VEHICLE

(71) Applicant: SAMSUNG ELECTRONICS CO., LTD., Suwon-si (KR)

(72) Inventor: Jung Wook Lim, Hwaseong-si (KR)

(73) Assignee: Samsung Electronics Co., Ltd., Suwoni-si (KR)

( * ) Notice: Subject to any disclaimer, the term of this patent is extended or adjusted under 35 U.S.C. 154(b) by 0 days.

(21) Appl. No.: 17/743,109

(22) Filed: May 12, 2022

(65) Prior Publication Data

US 2023/0088705 A1    Mar. 23, 2023

(30) Foreign Application Priority Data

Sep. 17, 2021    (KR) .................. 10-2021-0124935

(51) Int. Cl.
*H04N 25/616* (2023.01)
*H04N 25/79* (2023.01)
(Continued)

(52) U.S. Cl.
CPC ......... *H04N 25/616* (2023.01); *H04N 25/709* (2023.01); *H04N 25/767* (2023.01); *H04N 25/771* (2023.01); *H04N 25/79* (2023.01); *H01L 27/14603* (2013.01); *H01L 27/14614* (2013.01); *H01L 27/14643* (2013.01); *H04N 25/59* (2023.01)

(58) Field of Classification Search
CPC .. H04N 25/616; H04N 25/709; H04N 25/767; H04N 25/771; H04N 25/79; H04N 25/59; H04N 25/77; H04N 25/75; H04N 25/76; H04N 25/585; H04N 25/623; H01L 27/14603; H01L 27/14614; H01L 27/14643; H01L 27/14609; H01L 27/14612; H01L 27/146; H01L 2924/1434
See application file for complete search history.

(56) References Cited

U.S. PATENT DOCUMENTS 8,537,241 B2    9/2013    Monti et al.
8,643,132 B2    2/2014    Chen et al.
(Continued)

FOREIGN PATENT DOCUMENTS

KR    20170096601 A    8/2017

*Primary Examiner* — Abdelaaziz Tissire
(74) *Attorney, Agent, or Firm* — Myers Bigel, P.A.

(57) ABSTRACT

An image sensor with improved image quality is provided. An image sensor includes a pixel array including a plurality of unit pixels. Each of the unit pixels includes a first photoelectric converter configured to convert received light into charges, a first transfer transistor electrically connected between the first photoelectric converter and a first node, a connection transistor disposed connected to a second node and the first node, a dual conversion transistor electrically connected between a third node and the second node, a second transfer transistor electrically connected between a fourth node and the third node, a second photoelectric converter electrically connected to the fourth node and configured to convert the received light into charges, a first switch electrically connected to the second photoelectric converter and the fourth node, a first capacitor electrically connected to the fourth node, and a electrically second capacitor connected to the third node.

18 Claims, 23 Drawing Sheets

(51) Int. Cl.
    *H04N 25/709*    (2023.01)
    *H04N 25/767*    (2023.01)
    *H04N 25/771*    (2023.01)
    *H01L 27/146*    (2006.01)
    *H04N 25/59*    (2023.01)

(56) References Cited

U.S. PATENT DOCUMENTS

| | | | |
|---|---|---|---|
| 8,866,059 | B2 | 10/2014 | Murata et al. |
| 9,214,491 | B2 | 12/2015 | Okita |
| 10,044,960 | B2 | 8/2018 | Mao et al. |
| 10,404,928 | B2 | 9/2019 | Cheung et al. |
| 2004/0041077 | A1* | 3/2004 | Fossum ............. H01L 27/14609 348/E3.018 |
| 2006/0119720 | A1* | 6/2006 | Hong ..................... H04N 25/77 348/E3.018 |
| 2011/0007196 | A1* | 1/2011 | Yamashita ........... H04N 25/771 348/294 |
| 2014/0014816 | A1* | 1/2014 | Takeda ................... H04N 25/77 257/229 |
| 2016/0142657 | A1* | 5/2016 | Caulfield ............. H04N 25/616 348/308 |
| 2018/0241955 | A1* | 8/2018 | Sakano ................. H04N 25/59 |
| 2019/0075261 | A1* | 3/2019 | Machida ............. H04N 25/778 |
| 2020/0137325 | A1* | 4/2020 | Mori ................. H01L 27/14609 |

\* cited by examiner

UNIT PIXEL, IMAGE SENSOR AND VEHICLE

CROSS-REFERENCE TO RELATED APPLICATION

This application claims priority from Korean Patent Application No. 10-2021-0124935 filed on Sep. 17, 2021 in the Korean Intellectual Property Office, and all the benefits accruing therefrom under 35 U.S.C. 119, the contents of which in its entirety are herein incorporated by reference.

BACKGROUND

The present disclosure relates to a unit pixel, an image sensor, and a vehicle. More particularly, the present disclosure relates to a unit pixel, an image sensor including the unit pixel, and a vehicle including the image sensor.

An image sensing device is one of semiconductor devices that converts optical information into an electrical signal. The image sensing device may include a CCD (charge-coupled device) based image sensing device and/or a CMOS (complementary metal-oxide semiconductor) based image sensing device.

A CMOS image sensor may be abbreviated as CIS (CMOS image sensor). The CIS may include a plurality of pixels that are arranged two-dimensionally. Each of the pixels may include, for example, a photodiode (PD). The photodiode may serve to convert incident light thereto into an electrical signal.

Recently, with developments in the computer industry and in the communication industry, demand for image sensors with improved performance has increased in various fields such as digital cameras, camcorders, smartphones, game devices, security cameras, medical micro cameras, robots and/or vehicles.

SUMMARY

Aspects of the present disclosure provide a unit pixel with improved image quality.

Aspects of the present disclosure also provide an image sensor with improved image quality.

Aspects of the present disclosure also provide a vehicle including an image sensor with improved image quality.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized as shown in the claims and combinations thereof.

According to some aspects of the present disclosure, there is provided an image sensor including a pixel array including a plurality of unit pixels, wherein each of the unit pixels includes a first photoelectric converter configured to convert received light into charges, a first transfer transistor electrically connected between the first photoelectric converter and a first node, a connection transistor electrically connected between a second node and the first node, a dual conversion transistor electrically connected between a third node and the second node, a second transfer transistor electrically connected between a fourth node and the third node, a second photoelectric converter electrically connected to the fourth node and configured to convert the received light into charges, a first switch electrically connected between the second photoelectric converter and the fourth node, a first capacitor electrically connected to the fourth node, wherein the first capacitor is configured to store charges that overflow from the second photoelectric converter, and a second capacitor electrically connected to the third node, wherein the second capacitor is configured to store charges that overflow from the second photoelectric converter.

According to some aspects of the present disclosure, there is provided an unit pixel including a first photoelectric converter configured to convert received light into charges, a first transfer transistor electrically connected between the first photoelectric converter and a first node, a connection transistor electrically connected between a second node and the first node, a dual conversion transistor electrically connected between a third node and the second node, a second transfer transistor electrically connected between a fourth node and the third node, a second photoelectric converter connected to the fourth node for converting the received light into charges, a first switch electrically connected between the second photoelectric converter and the fourth node, a first capacitor electrically connected to the fourth node, wherein the first capacitor is configured to store charges that overflow from the second photoelectric converter, and a second capacitor electrically connected to the third node, wherein the second capacitor is configured to store charges that overflow from the second photoelectric converter, wherein the unit pixel is configured to perform operations including converting the charges accumulated in the first photoelectric converter into a first signal voltage and outputting the first signal voltage for a first time period, converting the charges accumulated in the first photoelectric converter into a second signal voltage and outputting the second signal voltage for a second time period subsequent to the first time period, and converting the charges accumulated in the first photoelectric converter the first capacitor, and the second capacitor into a third signal voltage and outputting the third signal voltage for a third time period subsequent to the second time period.

According to some aspects of the present disclosure, there is provided an unit pixel including a first photoelectric converter configured to convert received light into charges, a first transfer transistor electrically connected between the first photoelectric converter and a first node, a first connection transistor electrically connected between a second node and the first node, a dual conversion transistor electrically connected between a third node and the second node, a second connection transistor electrically connected between a fourth node and the third node, a second photoelectric converter electrically connected to the third node and configured to convert the received light into charges, a second transfer transistor electrically connected between the second photoelectric converter and the third node, a first capacitor configured to store charges that overflow from the second photoelectric converter, a second capacitor physically separated from the first capacitor, wherein the second capacitor is configured to store charges that overflow from the second photoelectric converter, a first switch configured to selectively electrically connect the first capacitor to the fourth node, a second switch configured to selectively electrically connect the second capacitor to the fourth node, a third switch configured to selectively electrically connect the first capacitor to the third node, and a fourth switch configured to selectively electrically connect the second capacitor to the third node.

According to some aspects of the present disclosure, there is provided a vehicle including an electronic control unit (ECU), and an image sensor connected to the electron control unit, wherein the image sensor includes a pixel array including a plurality of unit pixels, wherein each of the unit pixels includes a first photoelectric converter configured to convert received light into charges, a first transfer transistor electrically connected between the first photoelectric converter and a first node, a connection transistor electrically connected between a second node and the first node, a dual conversion transistor electrically connected between a third node and the second node, a second transfer transistor electrically connected between a fourth node and the third node, a second photoelectric converter connected to the fourth node and configured to convert the received light into charges, a first switch electrically connected between the second photoelectric converter and the fourth node, a first capacitor electrically connected to the fourth node, wherein the first capacitor is configured to store charges that overflow from the second photoelectric converter, and a second capacitor connected to the third node, wherein the second capacitor is configured to store charges that overflow from the second photoelectric converter.

Other features and embodiments may be apparent from the following detailed description, the drawings and the claims.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTIONS

Figure 1:
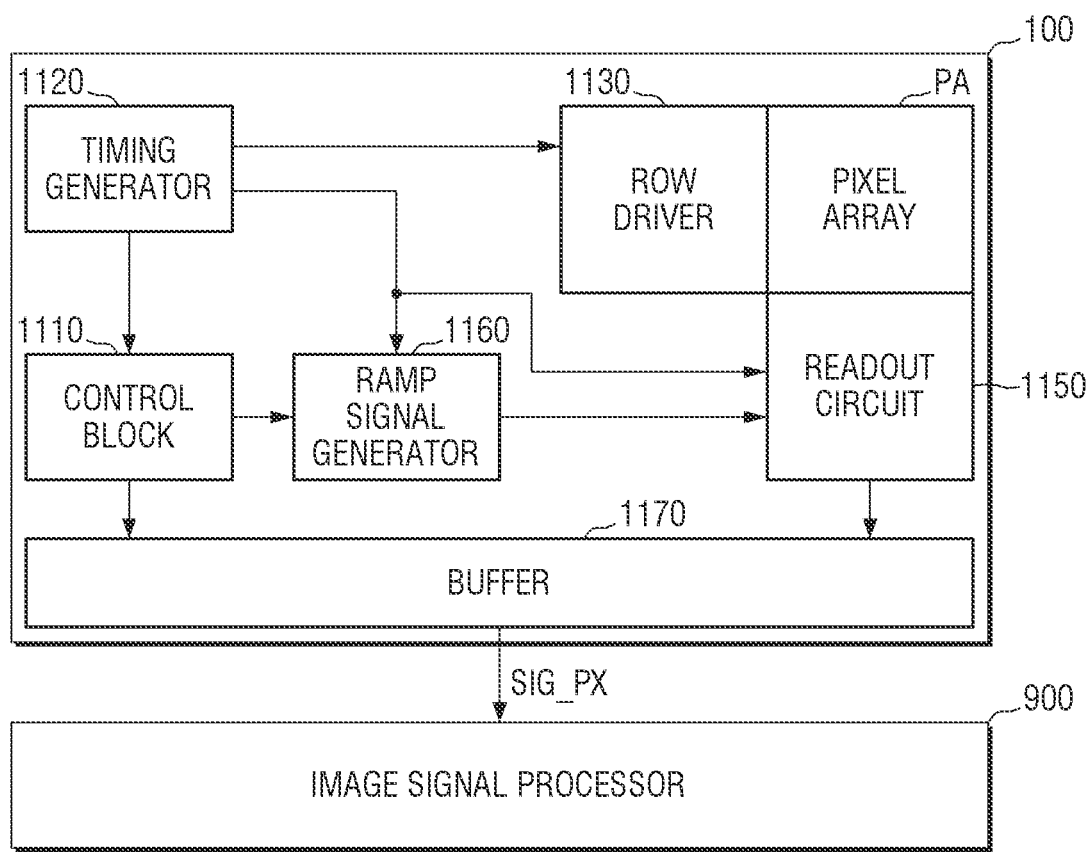
FIG. 1 is a block diagram of an image sensing device according to some embodiments of the present disclosure.

The same reference numbers in different drawings represent the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

It will be understood that, although the terms "first", "second", "third", and so on may be used herein for illustrating various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Hereinafter, embodiments according to the technical idea of the present disclosure will be described with reference to the accompanying drawings.

FIG. 1 is a block diagram of an image sensing device according to some embodiments of the present disclosure.

Referring to FIG. 1, an image sensing device 1 may include an image sensor 100 and an image signal processor 900.

The image sensor 100 may sense an image of a sensing target using light, and may generate a pixel signal SIG_PX based on the sensed image. In some embodiments, the generated pixel signal SIG_PX may be, for example, a digital signal. However, embodiments according to the technical idea of the present disclosure are not limited thereto. Further, the pixel signal SIG_PX may include a specific signal voltage or a reset voltage.

The pixel signal SIG_PX may be provided to the image signal processor 900 for processing thereof. The image signal processor 900 may receive the pixel signal SIG_PX output from a buffer 1170 of the image sensor 100 and process the received pixel signal SIG_PX for displaying thereof.

In some embodiments, the image signal processor 900 may perform digital binning on the pixel signal SIG_PX output from the image sensor 100. In this case, the pixel signal SIG_PX output from the image sensor 100 may be a raw image signal from a pixel array PA as not subjected to analog binning or may be a pixel signal SIG_PX subjected to analog binning.

In some embodiments, the image sensor 100 and the image signal processor 900 may be disposed separately from each other as shown. For example, the image sensor 100 may be mounted on a first chip, while the image signal processor 900 may be mounted on a second chip. In this case, the image sensor 100 and the image signal processor 900 may communicate with each other via a predefined interface. However, embodiments are not limited thereto. The image sensor 100 and the image signal processor 900 may be implemented into one package, for example, an MCP (multi-chip package).

The image sensor 100 may include a control register block 1110, a timing generator 1120, a row driver 1130, the pixel array PA, a read-out circuit 1150, a ramp signal generator 1160, and the buffer 1170.

The control register block 1110 may control overall operations of the image sensor 100. In particular, the control register block 1110 may transmit an operation signal directly to the timing generator 1120, the ramp signal generator 1160 and the buffer 1170.

The timing generator 1120 may generate a signal as a reference for an operation timing of various components of the image sensor 100. The operation timing reference signal generated by the timing generator 1120 may be transmitted to the row driver 1130, the read-out circuit 1150, the ramp signal generator 1160, and the like.

The ramp signal generator 1160 may generate and transmit a ramp signal used in the read-out circuit 1150. For example, the read-out circuit 1150 may include a correlated double sampler (CDS), a comparator, etc. The ramp signal generator 1160 may generate and transmit a ramp signal used in the correlated double sampler (CDS), the comparator, and the like.

The buffer 1170 may include, for example, a latch unit. The buffer 1170 may temporarily store therein the pixel signal SIG_PX to be provided to an external component, and may transmit the pixel signal SIG_PX to an external memory or an external device. The buffer 1170 may include a memory such as DRAM or SRAM.

The pixel array PA may sense an external image. The pixel array PA may include a plurality of pixels (or unit pixels). The row driver 1130 may selectively activate a row of the pixel array PA.

The read-out circuit 1150 may sample the pixel signal provided from the pixel array PA, compare the sampled signal with the ramp signal, and convert an analog image signal (data) into a digital image signal (data), based on the comparison result.

Figure 2:
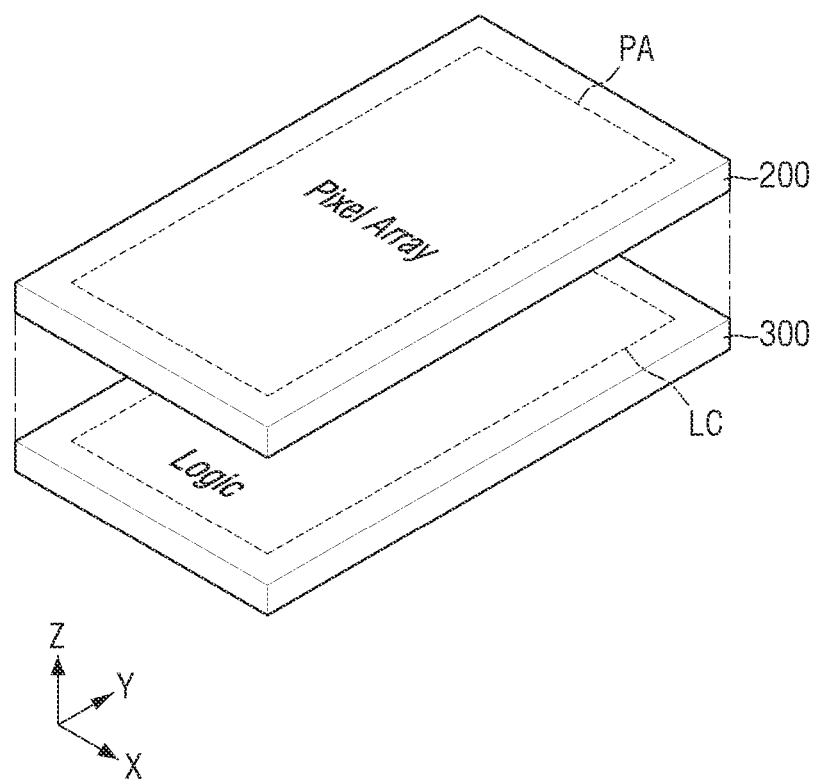
FIG. 2 is a diagram illustrating a conceptual layout of an image sensor according to some embodiments of the present disclosure.

FIG. 2 is a diagram illustrating a conceptual layout of an image sensor according to some embodiments of the present disclosure.

Referring to FIG. 2, the image sensor 100 according to some embodiments may include an upper chip 200 and a lower chip 300 as stacked vertically. In the upper chip 200, a plurality of pixels may be arranged in a two-dimensional array structure. That is, the upper chip 200 may include the pixel array PA. The lower chip 300 may include a logic area (LC) and a memory area. The lower chip 300 may be disposed below the upper chip 200, and may be electrically connected to the upper chip 200. The lower chip 300 may receive the pixel signal transmitted from the upper chip 200 and transmit the received pixel signal to the logic area LC of the lower chip 300.

The logic elements may be disposed in the logic area LC of the lower chip 300. The logic elements may include circuits for processing the pixel signal from the pixels. For example, the logic elements may include the control register block 1110, the timing generator 1120, the row driver 1130, the read-out circuit 1150, and the ramp signal generator 1160 of FIG. 1.

Figure 3:
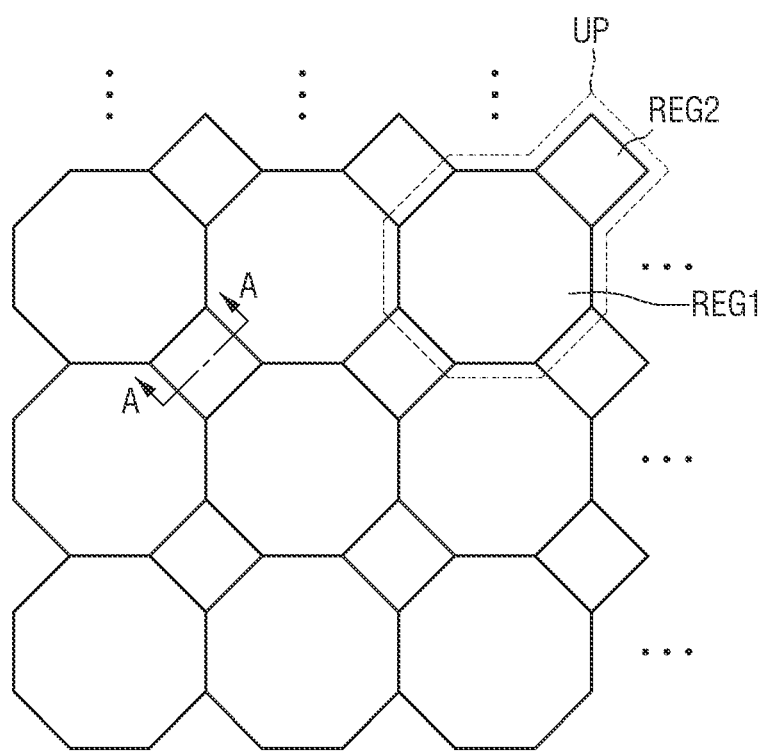
FIG. 3 is a top view of a pixel array according to some embodiments of the present disclosure.

FIG. 3 is a top view of a pixel array according to some embodiments of the present disclosure.

Referring to FIG. 3, the pixel array PA may include a plurality of unit pixels UPs. For example, the plurality of unit pixels UPs may be regularly arranged in a first direction X and a second direction Y. In this case, the unit pixel UP may be a unit of a pixel that receives light and outputs an image corresponding to one pixel.

The unit pixel UP may include a first area REG1 and a second area REG2. In this case, the first area REG1 and the second area REG2 may be distinguished from each other in a top view. The first area REG1 may have an octagonal shape as shown, while the second area REG2 may have a rectangular shape as shown. However, embodiments of the present disclosure are not limited thereto. The first area REG1 and the second area REG2 may contact each other. A size of the first area REG1 may be larger than a size of the second area REG2. That is, an amount of light incident on the first area REG1 may be greater than an amount of light incident on the second area REG2. The unit pixel UP corresponding to the first area REG1 and the second area REG2 may convert light to generate an electric signal.

Figure 4:
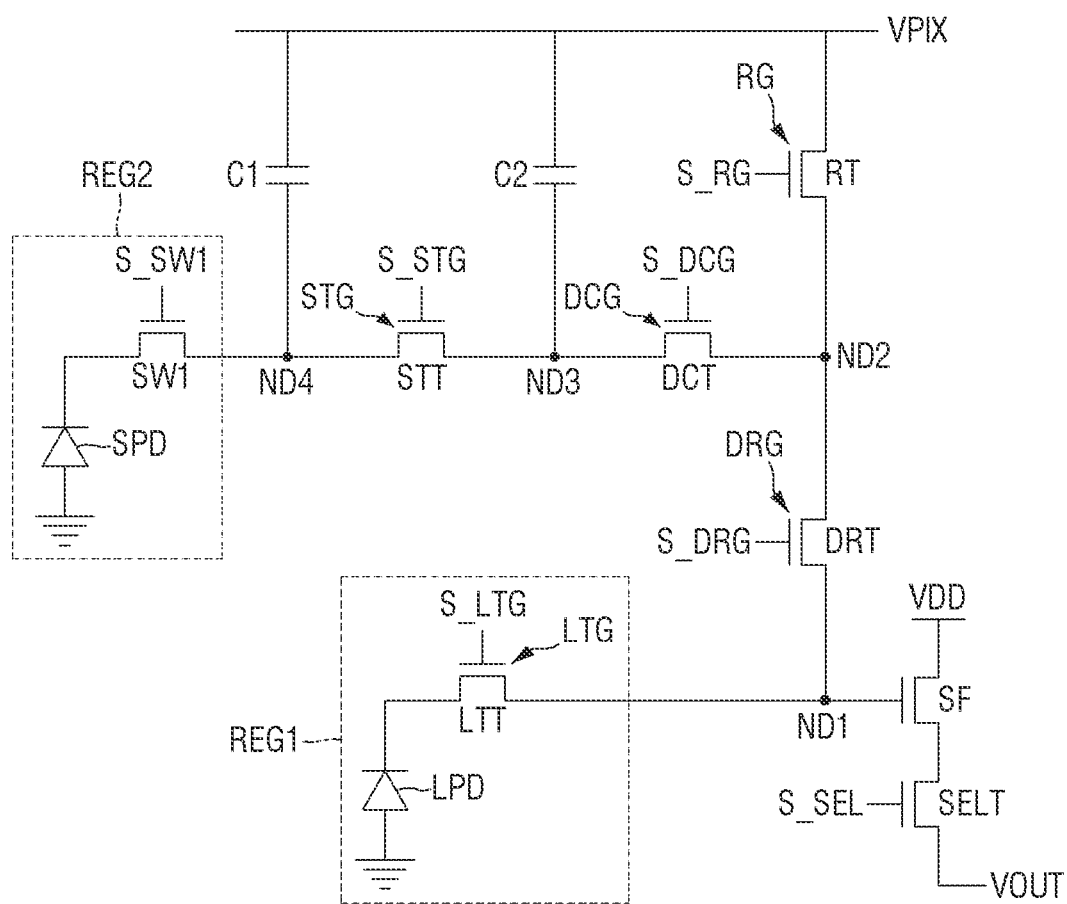
FIG. 4 is a circuit diagram of a unit pixel according to some embodiments of the present disclosure.

FIG. 4 is a circuit diagram of a unit pixel according to some embodiments of the present disclosure.

Referring to FIG. 4, the unit pixel may include a large photodiode LPD, a small photodiode SPD, a large transfer transistor LTT, a small transfer transistor STT, a source follower SF, a select transistor SELT, a connection transistor DRT, a reset transistor RT, a first switch SW1, a first capacitor C1, a second capacitor C2, and a dual conversion transistor DCT.

The large photodiode LPD may act as a photoelectric converter. That is, the large photodiode LPD may convert light incident to the first area REG1 into charges. The large photodiode LPD may be disposed in the first area REG1. Further, the large photodiode LPD may store converted charges therein. One end of the large photodiode LPD may be connected to a third voltage (e.g., a ground voltage). The large transfer transistor LTT may be disposed between and connected to the large photodiode LPD and a first node ND1. That is, a source and a drain of the large transfer transistor LTT may be respectively connected to one end of the large photodiode LPD and the first node ND1. The large transfer transistor LTT may include a large transfer gate LTG. A large transfer gate signal S_LTG may be applied to the large transfer gate LTG to control the large transfer transistor LTT. For example, when the large transfer gate signal S_LTG is pulled-up, the large transfer transistor LTT may be turned on such that the charges generated from the large photodiode LPD may be transferred to the first node ND1. In this case, the first node ND1 may act as a floating diffusion of the unit pixel. The large transfer transistor LTT may be disposed in the first area REG1. However, embodiments of the present disclosure is not limited thereto.

A gate of the source follower SF may be connected to the first node ND1. That is, the gate of the source follower SF may be connected to the floating diffusion, and may receive the charges therefrom. A source and a drain of the source follower SF may be respectively connected to a first voltage VDD (e.g., a power voltage) and one end of the select transistor SELT. The source follower SF may operate using the charges applied to the first node ND1. The select transistor SELT may include a source and a drain respectively connected to the source follower SF and an output voltage VOUT. A select signal S_SEL may be applied to a gate of the select transistor SELT to control the select transistor SELT. The select transistor SELT may operate only while the unit pixel UP is operating.

The connection transistor DRT may include a source and a drain respectively connected to the first node ND1 and a second node ND2. Further, the connection transistor DRT may include a connection gate DRG to which a connection gate signal S_DRG is applied. The connection transistor DRT may connect the first node ND1 and the second node ND2 to each other when the connection gate signal S_DRG is pulled-up.

The reset transistor RT may include a source and a drain respectively connected to the second node ND2 and a second voltage VPIX (e.g., a pixel voltage). The reset transistor RT may include a reset gate RG to which a reset gate signal S_RG is applied. The reset transistor RT may connect the second node ND2 to the second voltage VPIX when the reset gate signal S_RG is pulled-up, thereby resetting the unit pixel.

The dual conversion transistor DCT may be disposed between and connected to the second node ND2 and a third node ND3. That is, a source and a drain of the dual conversion transistor DCT may be respectively connected to both the second node ND2 and the third node ND3. A dual conversion gate signal S_DCG may be applied to a gate DCG of the dual conversion transistor DCT to connect the third node ND3 and the second node ND2 to each other.

The small photodiode SPD may act as a photoelectric converter. That is, the small photodiode SPD may convert light incident to the second area REG2 into charges. The small photodiode SPD may be disposed in the second area REG2. Further, the small photodiode SPD may store the converted charges therein. One end of the small photodiode SPD may be connected to the first switch SW1. The other end of the small photodiode SPD may be connected to the third voltage, for example, the ground voltage.

The first switch SW1 may be disposed between and connected to the small photodiode SPD and a fourth node ND4. A first switch signal S_SW1 may be applied to the first switch gate to control the first switch SW1. For example, when the first switch signal S_SW1 is pulled-up, the first switch SW1 may be turned on such that the charges generated from the small photodiode SPD may be transferred to the fourth node ND4. In this case, the fourth node ND4 may act as a channel area to be described later.

The small transfer transistor STT may be disposed between and connected to the fourth node ND4 and the third node ND3. The small transfer transistor STT may include a small transfer gate STG. A small transfer gate signal S_STG may be applied to the small transfer gate STG to control the small transfer transistor STT. For example, when the small transfer gate signal S_STG is pulled-up, the small transfer transistor STT may be turned on such that the charges generated from the small photodiode SPD may be transferred to the third node ND3. In this case, the third node ND3 may act as a floating diffusion of the unit pixel. That is, the third node ND3 may act as a floating diffusion different from that of the first node ND1. The small transfer transistor STT may be disposed in the second area REG2. However, embodiments of the present disclosure are not limited thereto.

The first capacitor C1 may be disposed between and connected to the fourth node ND4 and the second voltage VPIX (e.g., the pixel voltage). That is, the first capacitor C1 may be connected to both the first switch SW1 and the small transfer transistor STT. The first capacitor C1 may receive charges overflowing from the small photodiode SPD. Further, the first capacitor C1 may store therein the charges overflowing from the small photodiode SPD. In this case, the first capacitor C1 may not be disposed in the second area REG2. For example, the first capacitor C1 may be disposed in the lower chip (300 in FIG. 2).

The second capacitor C2 may be disposed between and connected to the third node ND3 and the second voltage VPIX (e.g., the pixel voltage). That is, the second capacitor C2 may be connected to both the dual conversion transistor DCT and the small transfer transistor STT. The second capacitor C2 may receive charges overflowing from the small photodiode SPD. Further, the second capacitor C2 may store therein the charges overflowing from the small photodiode SPD. In this case, the second capacitor C2 may not be disposed in the second area REG2. For example, the second capacitor C2 may be disposed in the lower chip (300 in FIG. 2).

The second area REG2 of the unit pixel in which the small photodiode SPD is disposed has a smaller size than a size of the first area REG1. Therefore, the small photodiode SPD may store therein an insufficient amount of the charges into which the received light is converted. In this case, the first capacitor C1 and the second capacitor C2 may store therein the charges overflowing from the small photodiode SPD, thereby increasing FWC (Full Well Capacity). That is, storing the charges in the first capacitor C1 and the second capacitor C2 may allow capacitance to be increased. Thus, the FWC may be increased. Thus, a dynamic range (DR) of a signal output from the unit pixel may be increased.

Figure 5:
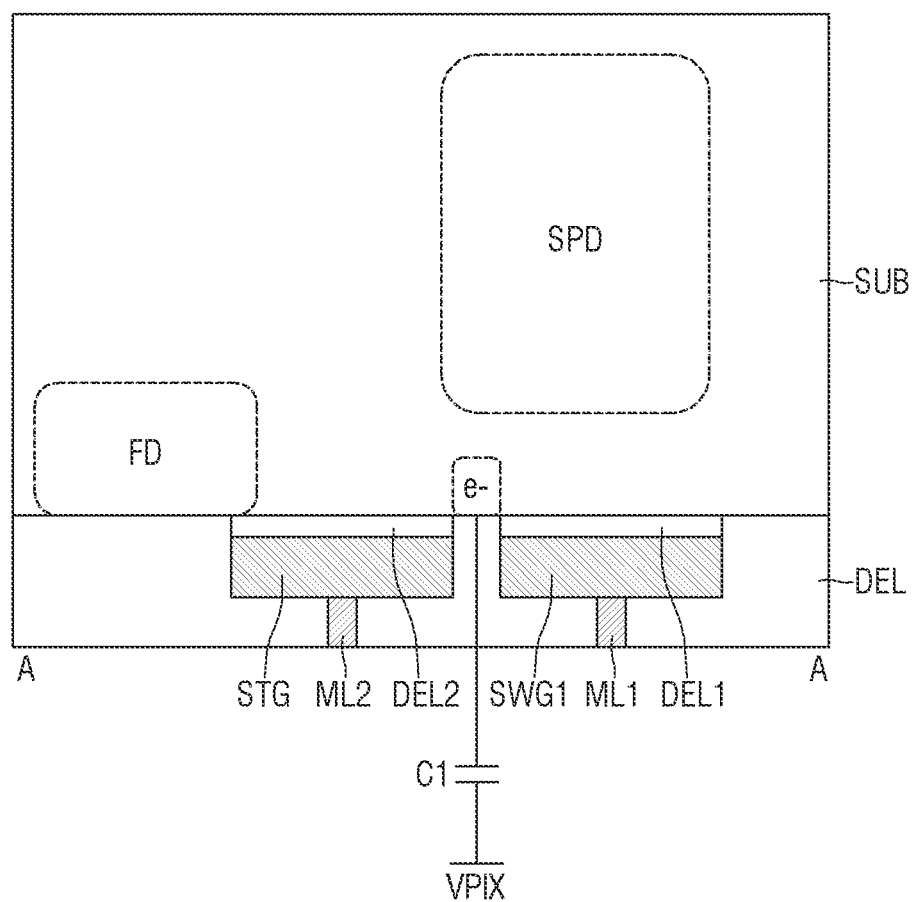
FIG. 5 is a cross-sectional view of the unit pixel cut along a line A-A of FIG. 3.

FIG. 5 is a cross-sectional view of the unit pixel cut along a line A-A of FIG. 3.

Referring to FIG. 5, the unit pixel may include a substrate SUB, an insulating layer DEL, a small photodiode SPD, a floating diffusion FD, a channel area e-, a first insulating layer DELL a first switch gate SWG1, a first metal layer ML1, a second insulating layer DEL2, a small transfer gate STG, a second metal layer ML2, etc. In this case, the small transfer gate STG may be included in the small transfer transistor STT of FIG. 4. The first switch gate SWG1 may be included in the first switch SW1 of FIG. 4. Further, the floating diffusion FD may act as the third node ND3 in FIG. 4.

The substrate SUB may be disposed on the insulating layer DEL. In this case, a top face of the substrate SUB may act as a face on which the light is incident. The small photodiode SPD and the floating diffusion FD may be disposed in the substrate SUB. The small photodiode SPD may convert the light incident thereto from a top face of the substrate SUB into charges. The small photodiode SPD may be disposed adjacent to the first switch gate SWG1 and the small transfer gate STG.

The first switch gate SWG1 may be disposed on the first insulating layer DELL Further, the first switch gate SWG1 may be connected to another circuit via the first metal layer ML1. The first switch gate SWG1 may receive a first switch gate signal S_SW1 via the first metal layer ML1. When the first switch gate signal S_SW1 is applied to the first switch gate SWG1, a channel may be formed in the substrate SUB under the first insulating layer DELL In this case, the charges may move from the small photodiode SPD to the channel area e- (the fourth node ND4 in FIG. 4). That is, the first switch gate SWG1 may connect the small photodiode SPD and the channel area e- to each other. Accordingly, the charges may be stored in the first capacitor C1 connected to the channel area e-.

The small transfer gate STG may be disposed on the second insulating layer DEL2. The small transfer gate STG may be connected to another circuit via the second metal layer ML2. The small transfer gate STG may receive a small transfer gate signal S_STG via the second metal layer ML2. When the small transfer gate signal S_STG is applied to the small transfer gate STG, a channel may be formed in the substrate SUB under the second insulating layer DEL2. In this case, the charges may move from the small photodiode SPD to the floating diffusion FD (the third node ND3 in FIG. 4). That is, the small transfer gate STG may connect the small photodiode SPD and the floating diffusion FD to each other. Accordingly, the charges may be stored in the second capacitor C2 connected to the floating diffusion FD.

In this connection, the first switch gate SWG1 and the small transfer gate STG may be disposed only in the insulating layer DEL, and may not be disposed within the substrate SUB. However, this is an example. Embodiments of the present disclosure are not limited thereto.

Next, referring to FIG. 4 to FIG. 12, an operation of the unit pixel UP is described.

Figure 6:
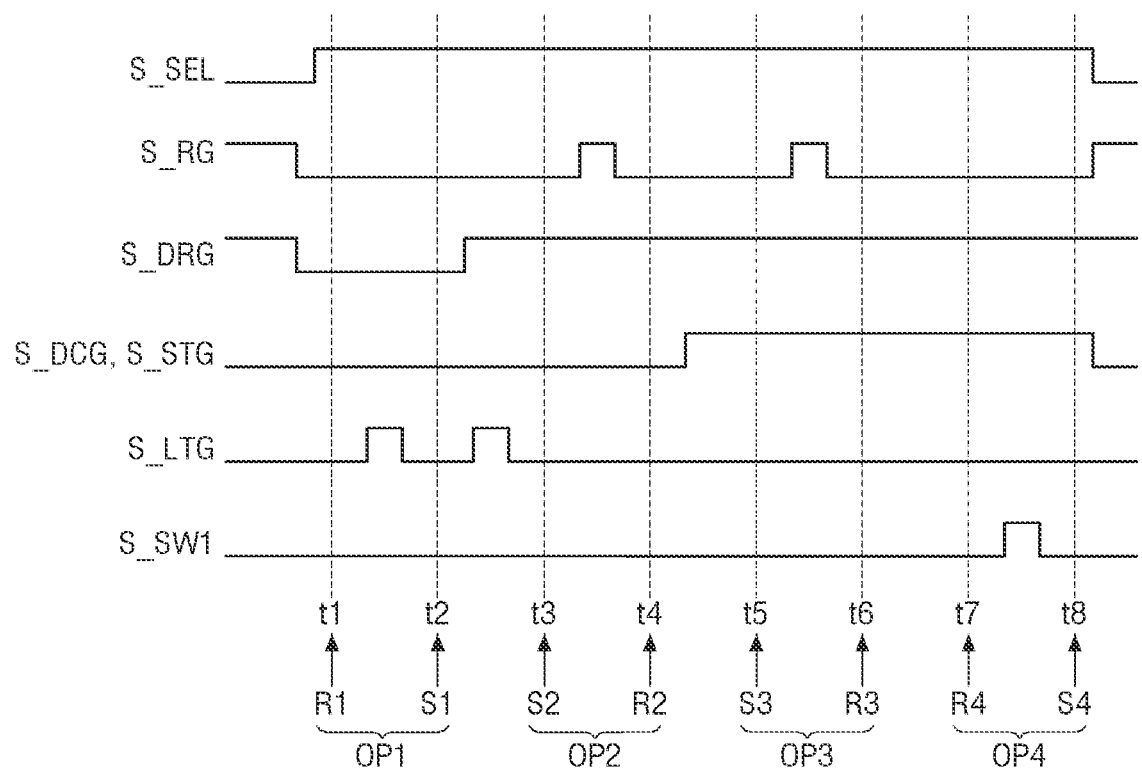
FIG. 6 is a timing diagram for illustrating a method for operating a unit pixel according to some embodiments of the present disclosure.
Figure 7:
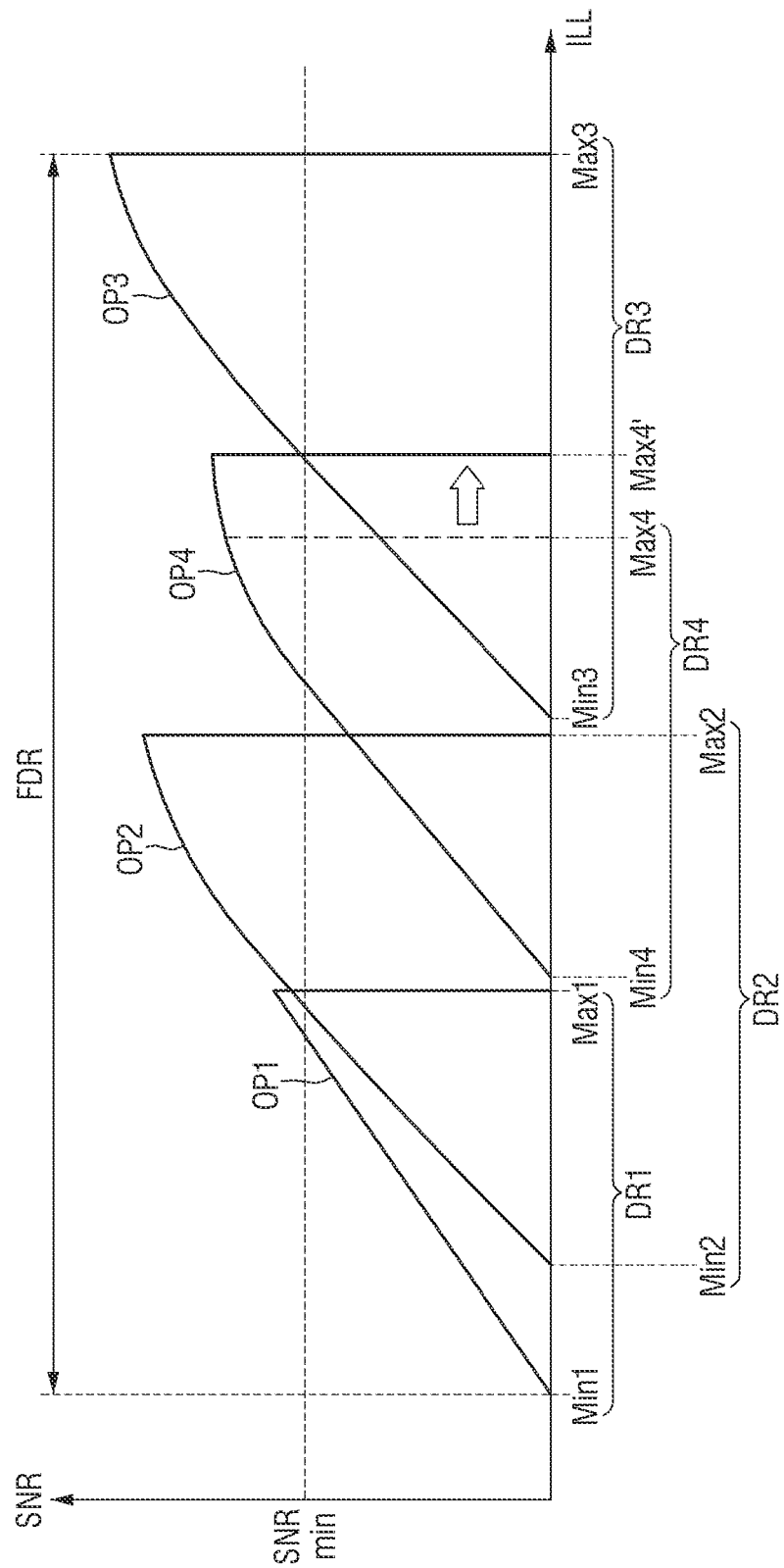
FIG. 7 is a diagram of a signal-to-noise ratio based on illuminance of a unit pixel according to some embodiments of the present disclosure under an operation of the unit pixel.

FIG. 6 is a timing diagram for illustrating a method for operating the unit pixel according to some embodiments of the present disclosure. FIG. 7 is a diagram of a signal-to-noise ratio based on a illuminance of the unit pixel according to some embodiments of the present disclosure under the operation of the unit pixel. FIG. 8 to FIG. 11 are diagrams for illustrating an operation of the unit pixel. FIG. 12 is a diagram for illustrating a voltage output from the image sensor.

Referring to FIG. 4 to FIG. 12, the unit pixel may perform a first reset operation R1 at a first time t1. For a time period before the first time t1, the select signal S_SEL may be pulled-up, and the reset gate signal S_RG may be pulled-down, and the connection gate signal S_DRG may be pulled-down. Further, the first switch signal S_SW1, the large transfer gate signal S_LTG, and the small transfer gate signal S_STG may be in a turned-off state. The storage gate signal S_SG may be in a turned-on state. Thus, a first reset voltage VR1 to which the charges accumulated in the first node ND1 are converted may be output at the first time t1. In this case, the source follower SF may convert the charges accumulated on the first node ND1 to the first reset voltage VR1.

Figure 8:
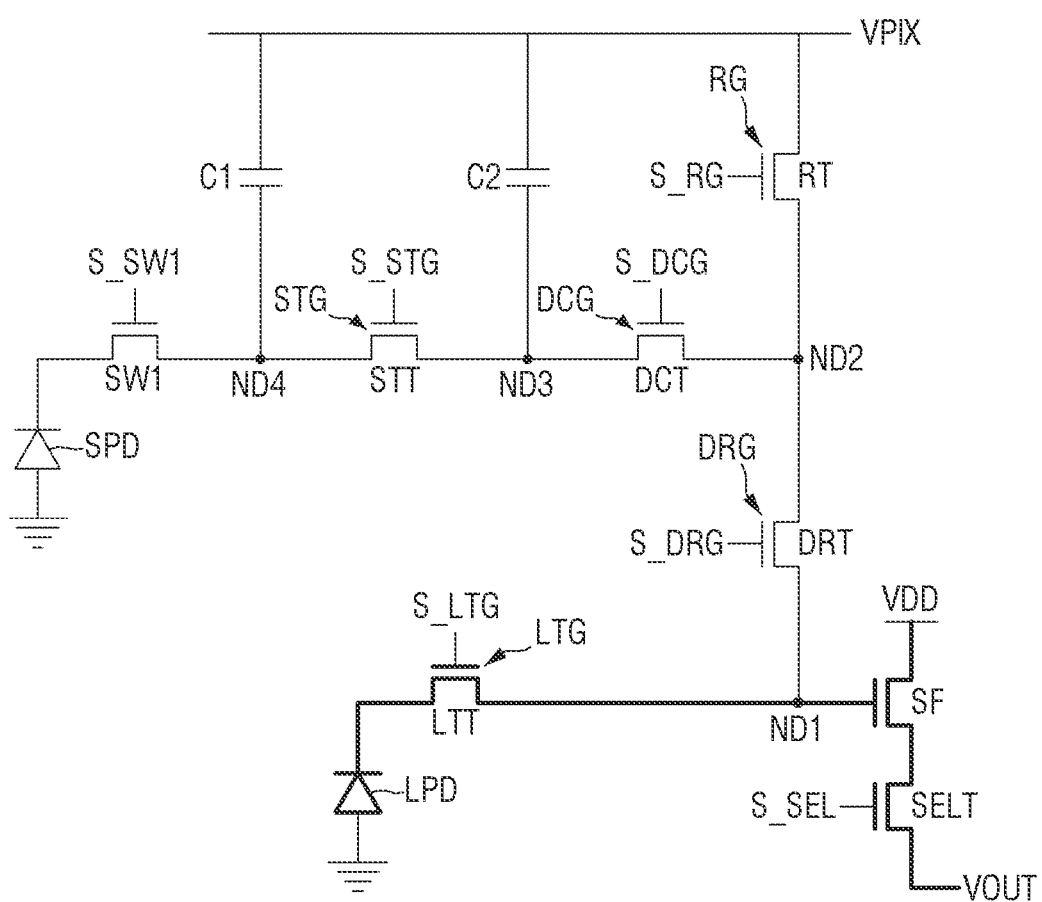
FIG. 8 to FIG. 11 are diagrams for illustrating an operation of the unit pixel of FIG. 4.

Referring to FIG. 6 to FIG. 8, the unit pixel UP may perform a first signal operation S1 at a second time t2. For a time period between the first time t1 and the second time t2, the large transfer gate signal S_LTG may be pulled-up and then pulled-down. As the large transfer gate signal S_LTG is pulled-up, the large transfer transistor LTT may be turned on. That is, the large transfer transistor LTT may connect the large photodiode LPD and the first node ND1 to each other. The large photodiode LPD may store therein charges before the large transfer gate signal S_LTG is pulled-up. The large transfer transistor LTT may transfer the charges generated from the large photodiode LPD to the first node ND1, that is, the floating diffusion. In this case, the charges transferred to the first node ND1 may be converted to a first signal voltage VS1 by the source follower SF. In this case, a capacitance of the unit pixel UP may be small. Accordingly, the full well capacity (FWC) thereof may be small.

Referring to FIG. 7, a first operation OP1 may include the first reset operation R1 and the first signal operation S1. In this case, the first operation OP1 may have a first minimum illuminance Min1 and a first maximum illuminance Max1. That is, the first operation OP1 may correspond to a first dynamic range DR1 from the first minimum illuminance Min1 to the first maximum illuminance Max1. A signal output for the first operation OP1 may have the first dynamic range DR1. In this case, the first dynamic range DR1 may be used for image sensing in a low-illuminance environment.

Figure 9:
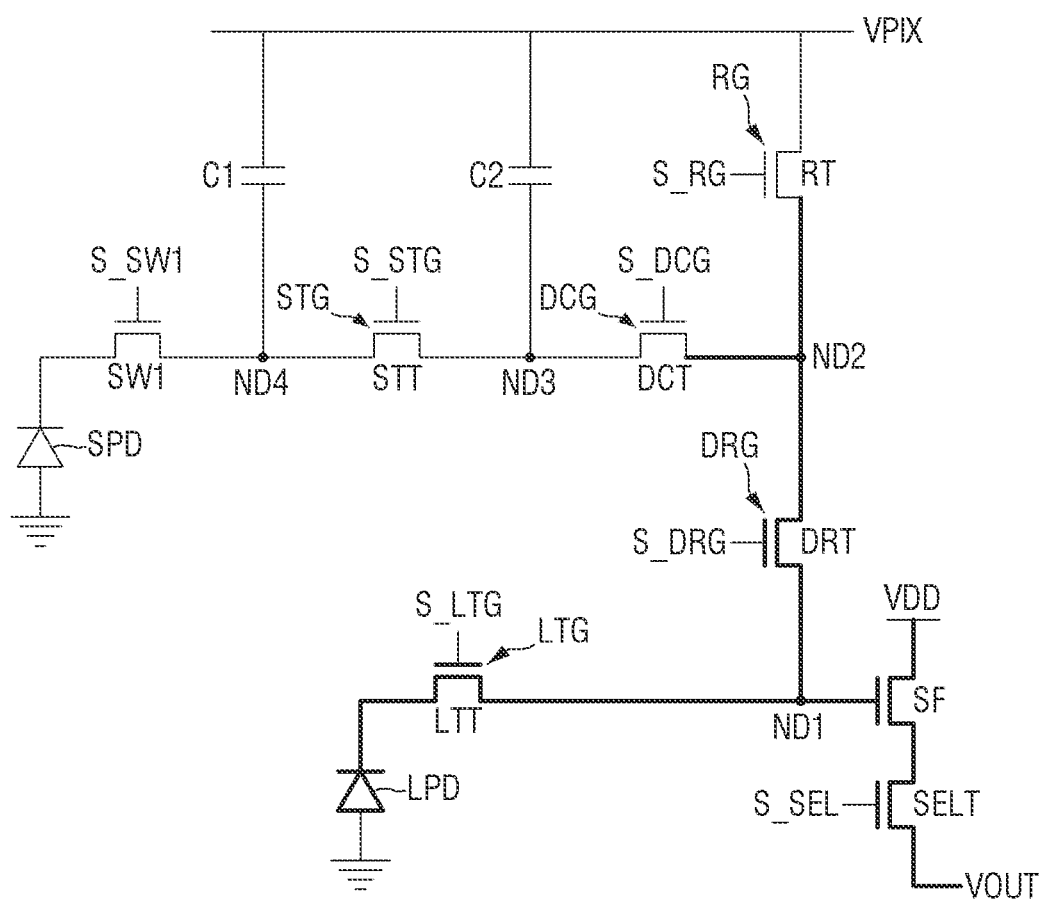

Referring to FIG. 4, FIG. 6 and FIG. 9, the unit pixel UP may perform a second signal operation S2 at a third time t3. For a time period between the second time t2 and the third time t3, the connection gate signal S_DRG may be pulled-up, and the large transfer gate signal S_LTG may be pulled-up and then pulled-down. As the connection gate signal S_DRG is pulled-up, the connection transistor DRT may connect the first node ND1 and the second node ND2 to each other. That is, the unit pixel UP may have a capacitance including capacitances of the first node ND1 and the second node ND2. Further, as the large transfer gate signal S_LTG is pulled-up, the charges may be transferred from the large photodiode LPD to the first node ND1. That is, the charges transmitted to the first node ND1, the second node ND2 and the large photodiode LPD may be converted into a second signal voltage VS2 by the source follower SF.

Further, the unit pixel UP may perform a second reset operation R2 at a fourth time t4. In this connection, the reset gate signal S_RG may be pulled-up and then pulled-down. Accordingly, the charges of the first node ND1 and the second node ND2 may be reset by the reset transistor RT. The source follower SF may convert the charges of the first node ND1 and the second node ND2 after the reset to the second reset voltage VR2 and then output the second reset voltage VR2.

Referring to FIG. 7, a second operation OP2 may include the second reset operation R2 and the second signal operation S2. In this case, the second operation OP2 may have a second minimum illuminance Min2 and a second maximum illuminance Max2. That is, the second operation OP2 may correspond to a second dynamic range DR2 from the second minimum illuminance Min2 to the second maximum illuminance Max2. A signal output for the second operation OP2 may have the second dynamic range DR2. The second dynamic range DR2 may partially overlap with the first dynamic range DR1. The second dynamic range DR2 may have the second minimum illuminance Min2 higher than the first minimum illuminance Min1 and the second maximum illuminance Max2 higher than the first maximum illuminance Max1. In this case, a signal-to-noise ratio of the second operation OP2 may be greater than a minimum signal-to-noise ratio SNRmin. In this case, the unit pixel UP may output a signal with lowered noise and a wider dynamic range.

Figure 10:
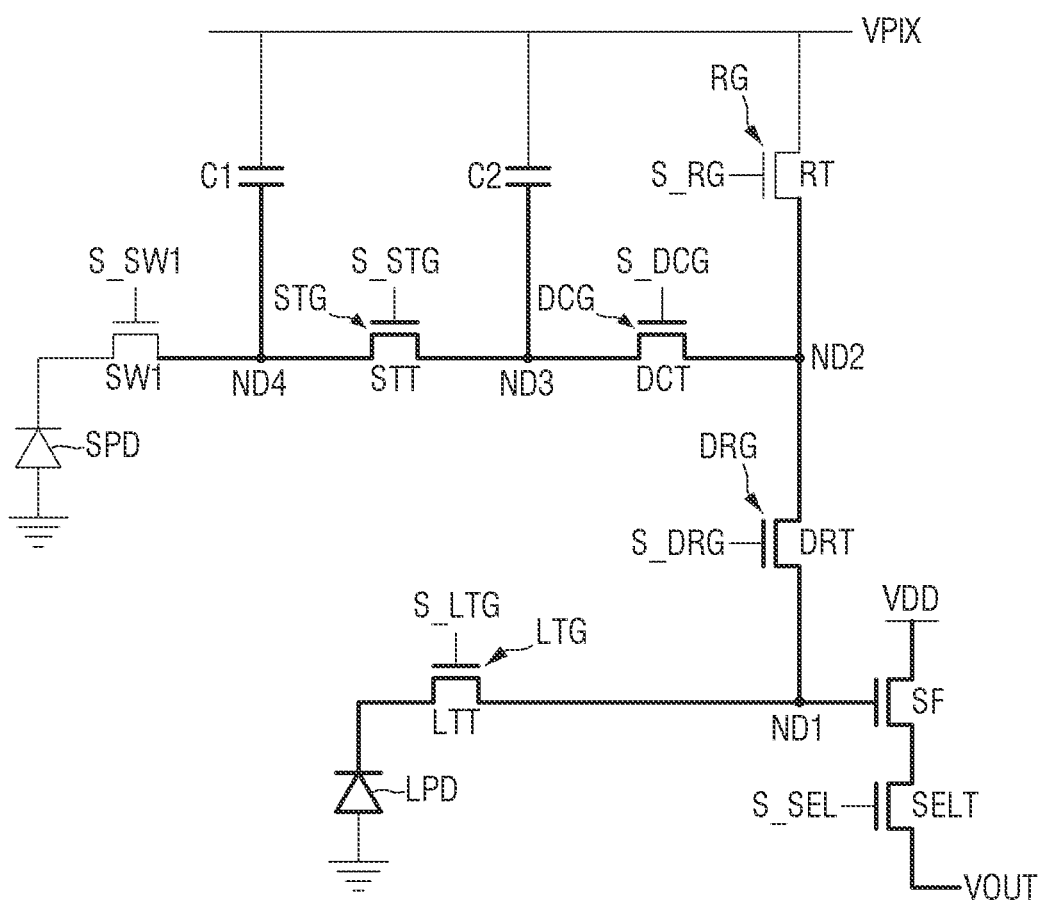

Referring to FIG. 4, FIG. 6, and FIG. 10, the unit pixel UP may perform a third signal operation S3 at a fifth time t5. For a time period between the fourth time t4 and the fifth time t5, the small transfer gate signal S_STG and the dual conversion gate signal S_DCG may be pulled-up. That is, the small transfer transistor STT and the dual conversion gate DCG may be turned on to connect the second node ND2, the third node ND3, and the fourth node ND4 to each other. That is, at the fifth time t5, the charges accumulated in the first node ND1, the second node ND2, the third node ND3, and the fourth node ND4 may be converted to a third signal voltage VS3 via the source follower SF. The unit pixel UP may have a capacitance including capacitances of the first node ND1, the second node ND2, the third node ND3, and the fourth node ND4. That is, the unit pixel UP may have a high capacitance and a high full well capacity (FWC) at the fifth time t5. In this case, the charges charged in the first capacitor C1 may be transferred through the fourth node ND4. Further, the charges charged in the second capacitor C2 may be transferred through the third node ND3.

The unit pixel UP may perform a third reset operation R3 at a sixth time t6. In this case, a reset gate signal S_RG may be pulled-up and then pulled-down. Accordingly, the charges of the first node ND1, the second node ND2, the third node ND3, and the fourth node ND4 may be reset by the reset transistor RT. The source follower SF may convert the charges of the first node ND1, the second node ND2, the third node ND3 and the fourth node ND4 after the reset into a third reset voltage VR3 and then may output the third reset voltage VR3.

Referring to FIG. 7, a third operation OP3 may include the third reset operation R3 and the third signal operation S3. In this case, the third operation OP3 may have a third minimum illuminance Min3 and a third maximum illuminance Max3. That is, the third operation OP3 may correspond to a third dynamic range DR3 from the third minimum illuminance Min3 to the third maximum illuminance Max3. A signal output for the third operation OP3 may have the third dynamic range DR3. The third dynamic range DR3 may not overlap the first and second dynamic ranges DR1 and DR2. The third dynamic range DR3 may have the third minimum illuminance Min3 and the third maximum illuminance Max3 higher than the second dynamic range DR2. In this case, a signal-to-noise ratio of the third operation OP3 may be greater than the minimum signal-to-noise ratio SNRmin. In this case, the unit pixel UP outputs a signal into which the charges charged in the first to fourth nodes ND1 to ND4, the first capacitor C1 and the second capacitor C2 are converted. Therefore, a capacitance of the unit pixel UP may be large, and the full well capacity (FWC) thereof may also be large. In this case, the third dynamic range DR3 may be used for image sensing in a high illuminance environment.

Referring to FIG. 4 and FIG. 6, the unit pixel UP may perform a fourth reset operation R4 at a seventh time t7. For a time period between the sixth time t6 and the seventh time t7, a signal may not be changed. The source follower SF may convert the charges accumulated in the first node ND1, the second node ND2, the third node ND3 and the fourth node ND4 to a fourth reset voltage VR4 and may output the fourth reset voltage VR4. In this case, the fourth reset operation R4 may be omitted. For example, when the fourth reset operation R4 is omitted, the third reset voltage VR3 generated in the third reset operation R3 may be used.

Figure 11:
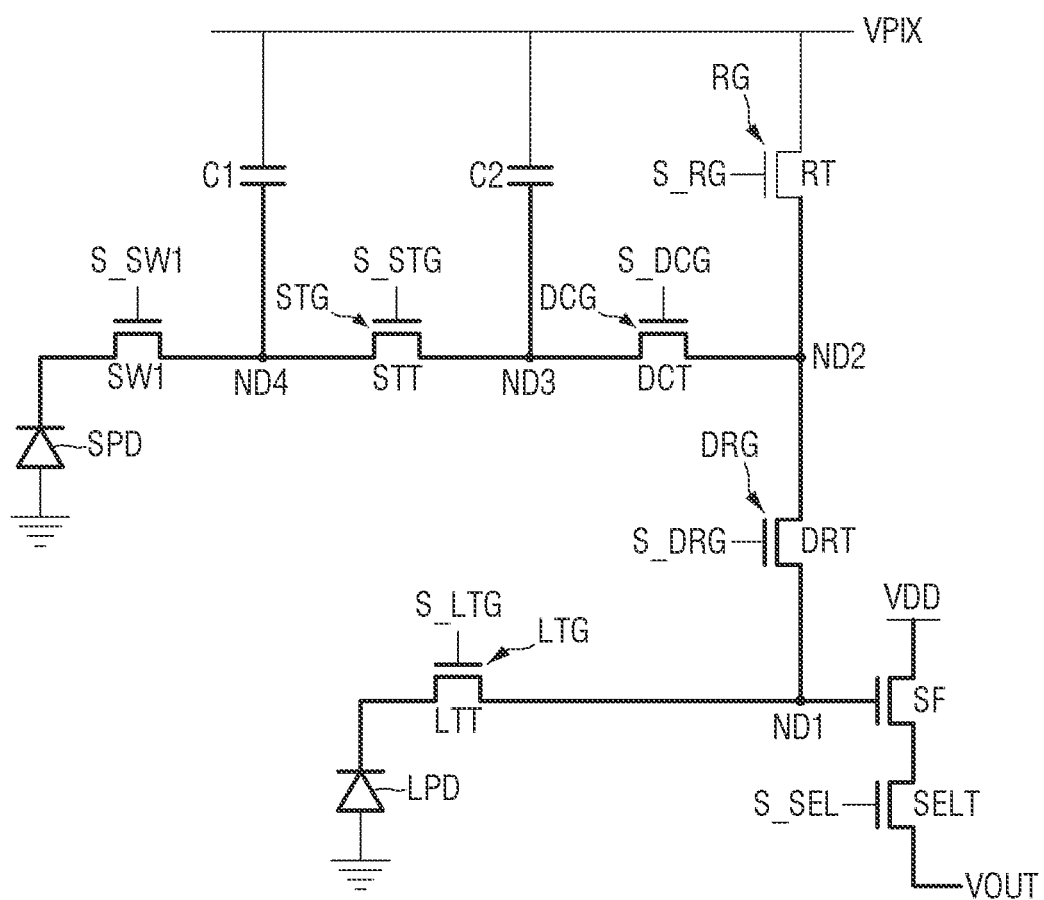
Figure 12:
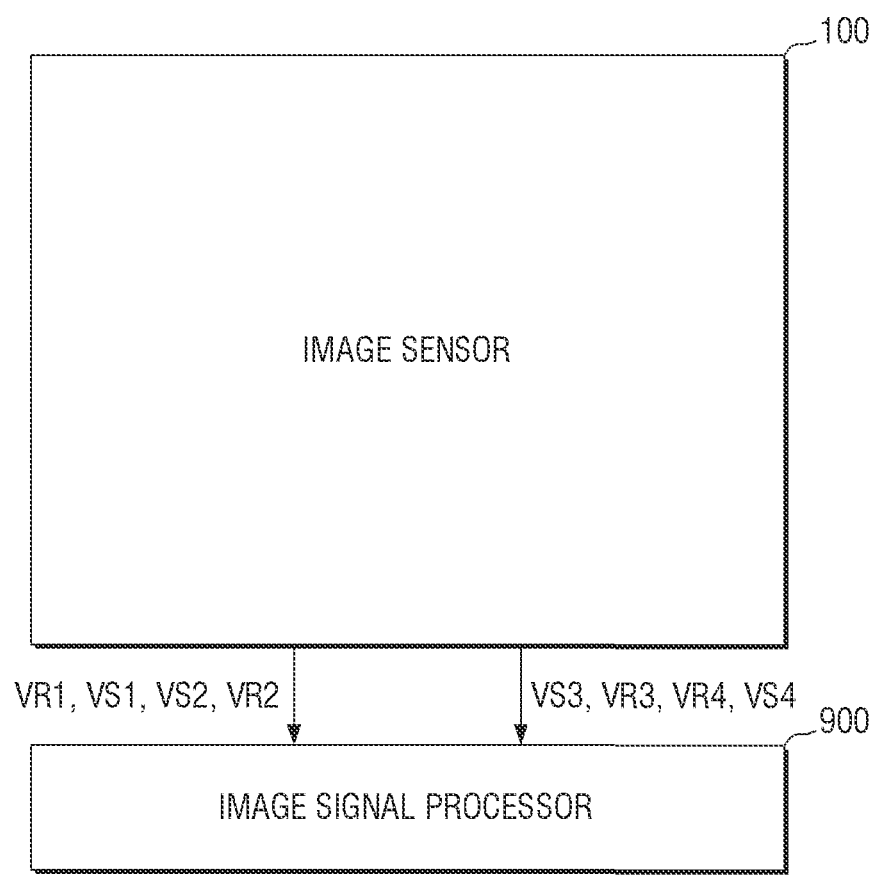
FIG. 12 is a diagram for illustrating a voltage output from the image sensor in FIG. 2.

Referring to FIG. 6 and FIG. 11, the unit pixel UP may perform a fourth signal operation S4 at an eighth time t8. For a time period between the seventh time t7 and the eighth time t8, the first switch signal S_SW1 may be pulled-up and then pulled-down. In this case, the first switch SW1 may connect the fourth node ND4 and small photodiode SPD to each other. That is, the unit pixel may output a fourth signal voltage VS4 into which the charges accumulated in the first to fourth nodes ND1, ND2, ND3, and ND4, the small photodiode SPD, and the first capacitor C1 and the second capacitor C2 are converted. In this case, a capacitance of the unit pixel may be relatively large. Accordingly, the full well capacity (FWC) thereof may be large.

Referring to FIG. 7, a fourth operation OP4 may include the fourth reset operation R4 and the fourth signal operation S4. In this case, the fourth operation OP4 may have a fourth minimum illuminance Min4 and a fourth maximum illuminance Max4'. That is, the fourth operation OP4 may correspond to a fourth dynamic range DR4 from the fourth minimum illuminance Min4 to fourth maximum illuminance Max4'. A signal output for the fourth operation OP4 may have the fourth dynamic range DR4.

In this case, a maximum illuminance of the unit pixel when the first capacitor C1 is absent may correspond to the fourth maximum illuminance Max4. However, a maximum illuminance of the unit pixel when the first capacitor C1 according to some embodiments of the present disclosure is connected to the fourth node ND4 may correspond to the fourth maximum illuminance Max4'. That is, because the unit pixel includes the first capacitor C1 and the first capacitor C1 stores therein the charges overflowing from the small photodiode SPD, the full well capacity (FWC) of the unit pixel UP may be increased. Accordingly, the fourth dynamic range DR4 may be increased. Further, a portion the fourth dynamic range DR4 which exceeds the minimum signal-to-noise ratio SNRmin increases such that the image quality may be improved.

In summary, even when the small photodiode SPD is disposed in the second area REG2 having a smaller area, the full well capacity (FWC) increases and thus the image quality may be improved because the first capacitor C1 is connected to the small photodiode SPD. Referring to FIG. 7, the unit pixel may output a signal having a full dynamic range FDR including the first to fourth dynamic ranges DR1, DR2, DR3, and DR4. Therefore, the image sensor 100 may output an image with improved quality under both low illuminance and high illuminance environments. Further, because the first switch SW1 is disposed between and connected to the first capacitor C1 and the small photodiode SPD, a correlated double sampling (CDS) operation on the small photodiode SPD may be performed, thereby reducing the noise of the output image.

Figure 13:
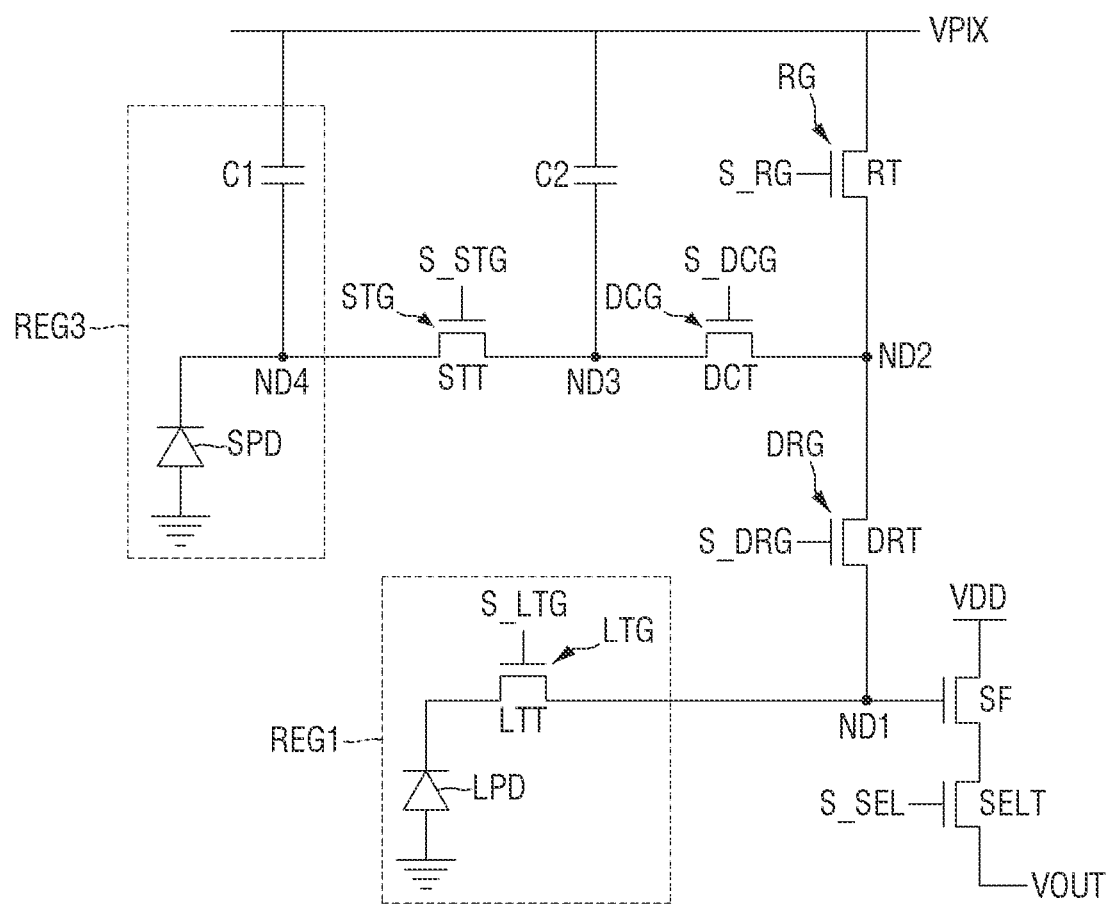
FIG. 13 is a circuit diagram of a unit pixel according to some embodiments of the present disclosure.

Hereinafter, with reference to FIG. 13, a unit pixel according to some embodiments of the present disclosure will be described. FIG. 13 is a circuit diagram of a unit pixel according to some embodiments of the present disclosure. For convenience of description, components duplicate with those as described above are briefly described or descriptions thereof are omitted.

Referring to FIG. 13, the first switch SW1 of the unit pixel shown in FIG. 4 may be always turned on. That is, as shown in FIG. 13, the small photodiode SPD and the first capacitor C1 in a third area REG3 may be disposed to be directly connected to each other, compared with FIG. 4. Accordingly, the charges overflowing from the small photodiode SPD may be stored in the first capacitor C1, thereby increasing the full well capacity (FWC). Further, thus, the dynamic range of the signal output from the unit pixel may be increased.

Figure 14:
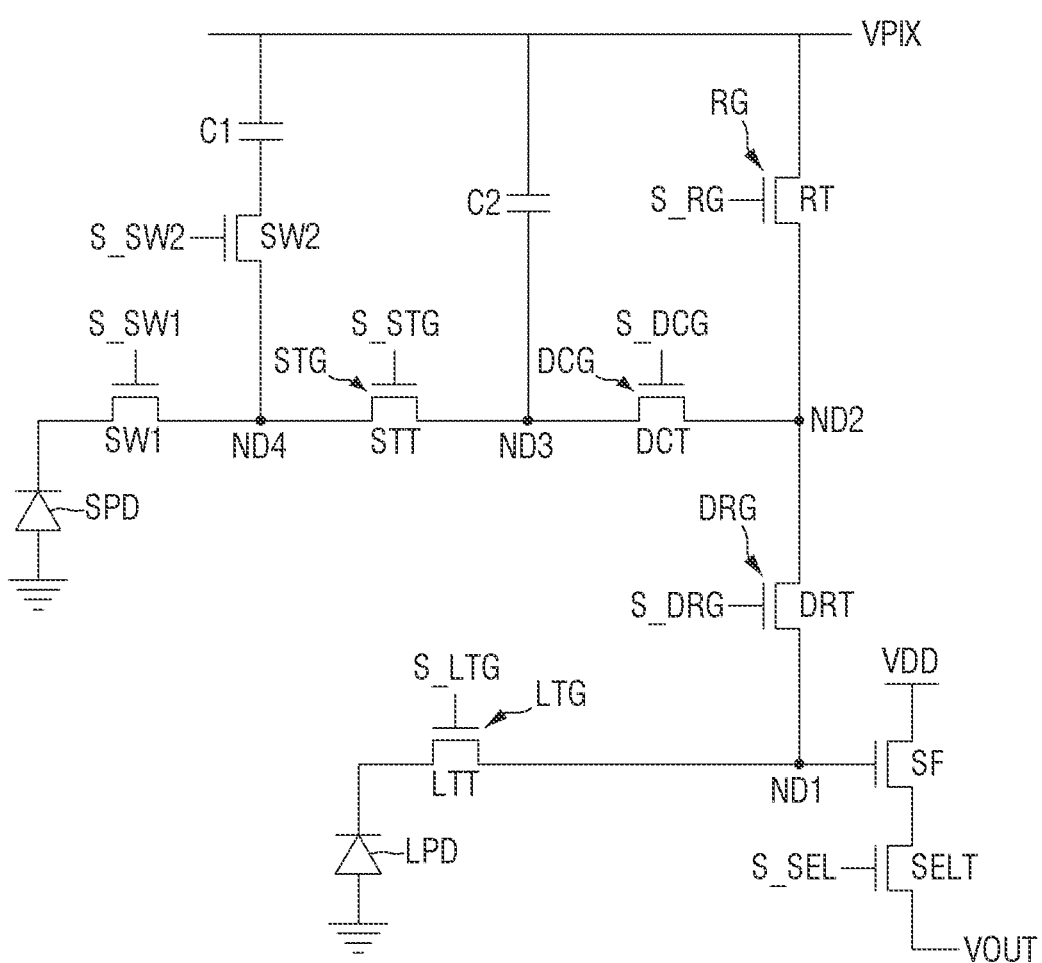
FIG. 14 is a circuit diagram of a unit pixel according to some embodiments of the present disclosure.
Figure 15:
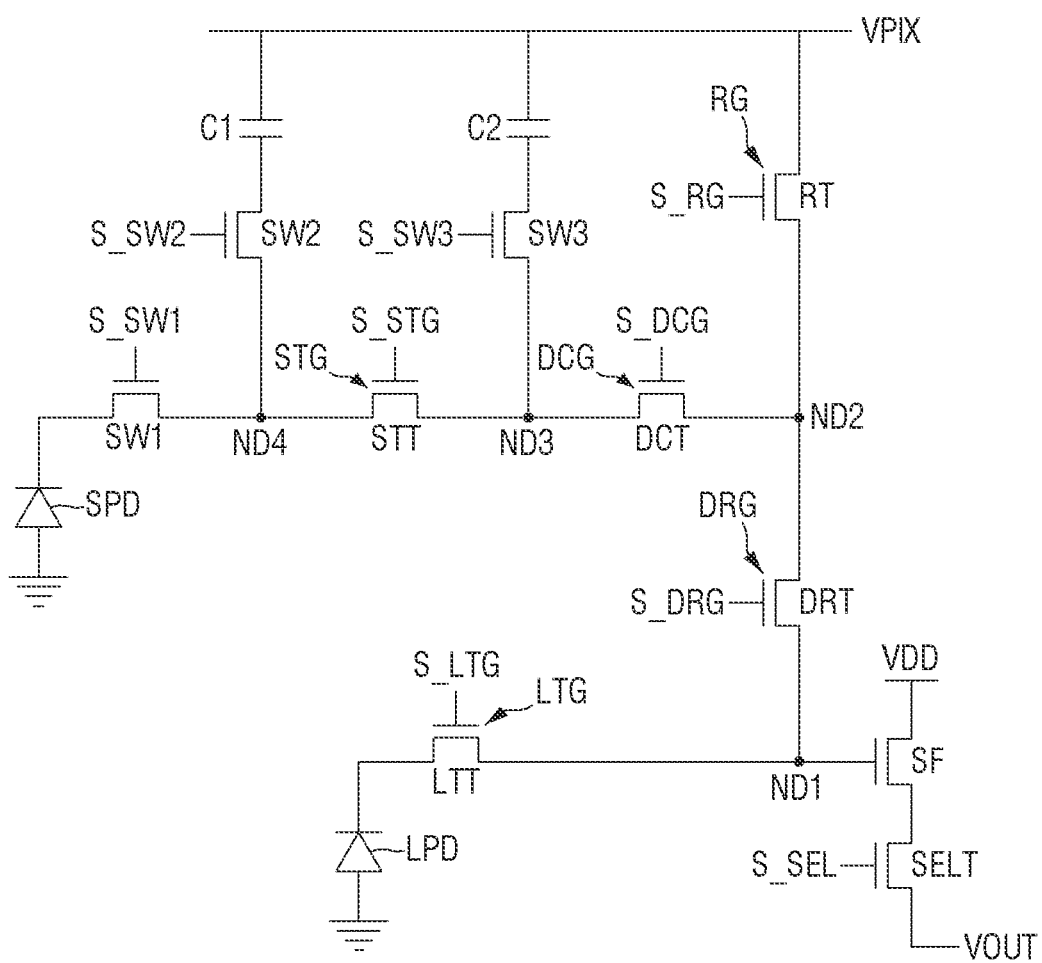
FIG. 15 is a circuit diagram of a unit pixel according to some embodiments of the present disclosure.
Figure 16:
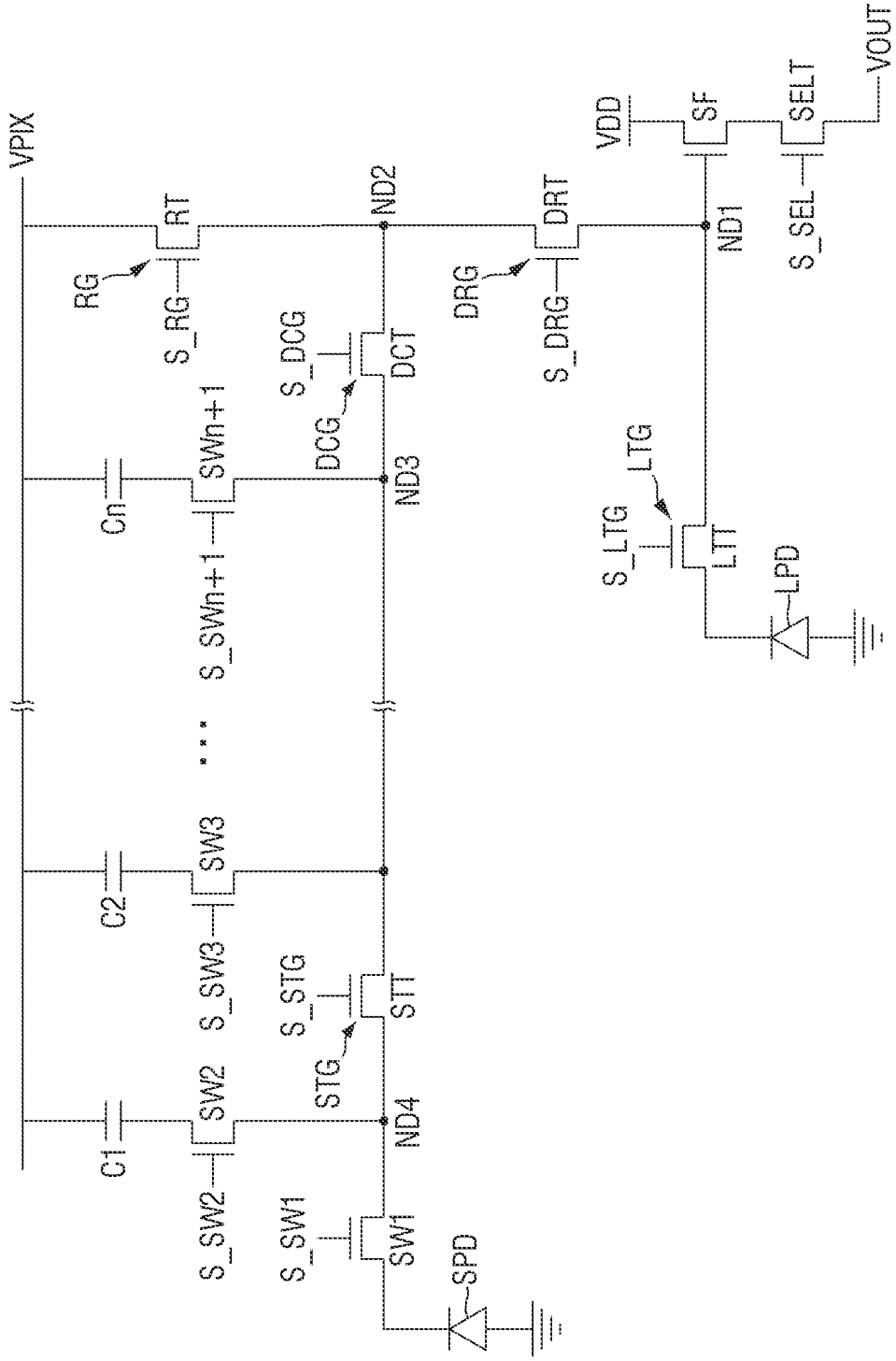
FIG. 16 is a circuit diagram of a unit pixel according to some embodiments of the present disclosure.

Next, with reference to FIG. 14 and FIG. 16, unit pixels according to some embodiments of the present disclosure will be described. FIG. 14 is a circuit diagram of a unit pixel according to some embodiments of the present disclosure. FIG. 15 is a circuit diagram of a unit pixel according to some embodiments of the present disclosure. FIG. 16 is a circuit diagram of a unit pixel according to some embodiments of the present disclosure. For convenience of description, components duplicate with those as described above are briefly described or descriptions thereof are omitted.

Referring to FIG. 14, the unit pixel may further include a second switch SW2. The second switch SW2 may be disposed between and connected to the fourth node ND4 and the first capacitor C1. A second switch signal S_SW2 may be applied to the second switch SW2 to control the second switch SW2. For example, when the second switch signal S_SW2 is pulled-up, the second switch SW2 may be turned on to transfer the charges generated from the small photodiode SPD to the first capacitor C1. In this case, when the second switch SW2 is turned off, the first capacitor C1 may not be connected to the fourth node ND4, and the capacitance of the unit pixel may be reduced. Accordingly, the full well capacity (FWC) of the unit pixel may be smaller. Accordingly, the unit pixel may operate in an HCG (high conversion gain) state. However, when the second switch SW2 is turned on, the first capacitor C1 may be connected to the fourth node ND4, and the capacitance of the unit pixel may increase. Accordingly, the full well capacity (FWC) of the unit pixel may be larger. Accordingly, the unit pixel may operate in a LCG (low conversion gain) state. That is, due to the second switch SW2, the unit pixel may operate in different modes.

Referring to FIG. 15, the unit pixel may further include a third switch SW3. The third switch SW3 may be disposed between and connected to the third node ND3 and the second capacitor C2. A third switch signal S_SW3 may be applied to the third switch SW3 to control the third switch SW3. For example, when the third switch signal S_SW3 is pulled-up, the third switch SW3 may be turned on to transfer charges generated from the small photodiode SPD to the second capacitor C2. In this case, when the third switch SW3 is turned off, the second capacitor C2 may not be connected to the third node ND3, and the capacitance of the unit pixel may be reduced. Accordingly, the full well capacity (FWC) of the unit pixel may be smaller. Accordingly, the unit pixel may operate in the HCG state. However, when the third switch SW3 is turned on, the second capacitor C2 may be connected to the third node ND3, and the capacitance of the unit pixel may increase. Accordingly, the full well capacity (FWC) of the unit pixel may be larger. Accordingly, the unit pixel may operate in the LCG state. That is, due to the third switch SW3, the unit pixel may operate in different modes.

Referring to FIG. 16, the unit pixel may further include a third capacitor C3, . . . an n-th capacitor Cn, and a fourth switch SW4, . . . a (n+1)-th switch SWn+1. The third capacitor C3, . . . the n-th capacitor Cn may be connected to the third node ND3. Each of the fourth switch SW4, . . . the (n+1)-th switch SWn+1 may be disposed between and connected to the third node ND3 and each of the third capacitor C3, . . . the n-th capacitor Cn. A (n+1)-th switch signal S_SWn+1 may be applied to the (n+1)-th switch SWn+1 to control the n-th switch SWn+1. For example, when the (n+1)-th switch signal S_SWn+1 is pulled-up, the (n+1)-th switch SWn+1 may be turned on to transfer charges generated from the small photodiode SPD to the n-th capacitor Cn. Due to each of the switches SW2, SW3, . . . SWn+1, the unit pixel may operate in different modes CG.

Next, with reference to FIG. 17, a unit pixel according to some embodiments of the present disclosure will be described. For convenience of description, components duplicate with those as described above are briefly described or descriptions thereof are omitted.

Figure 17:
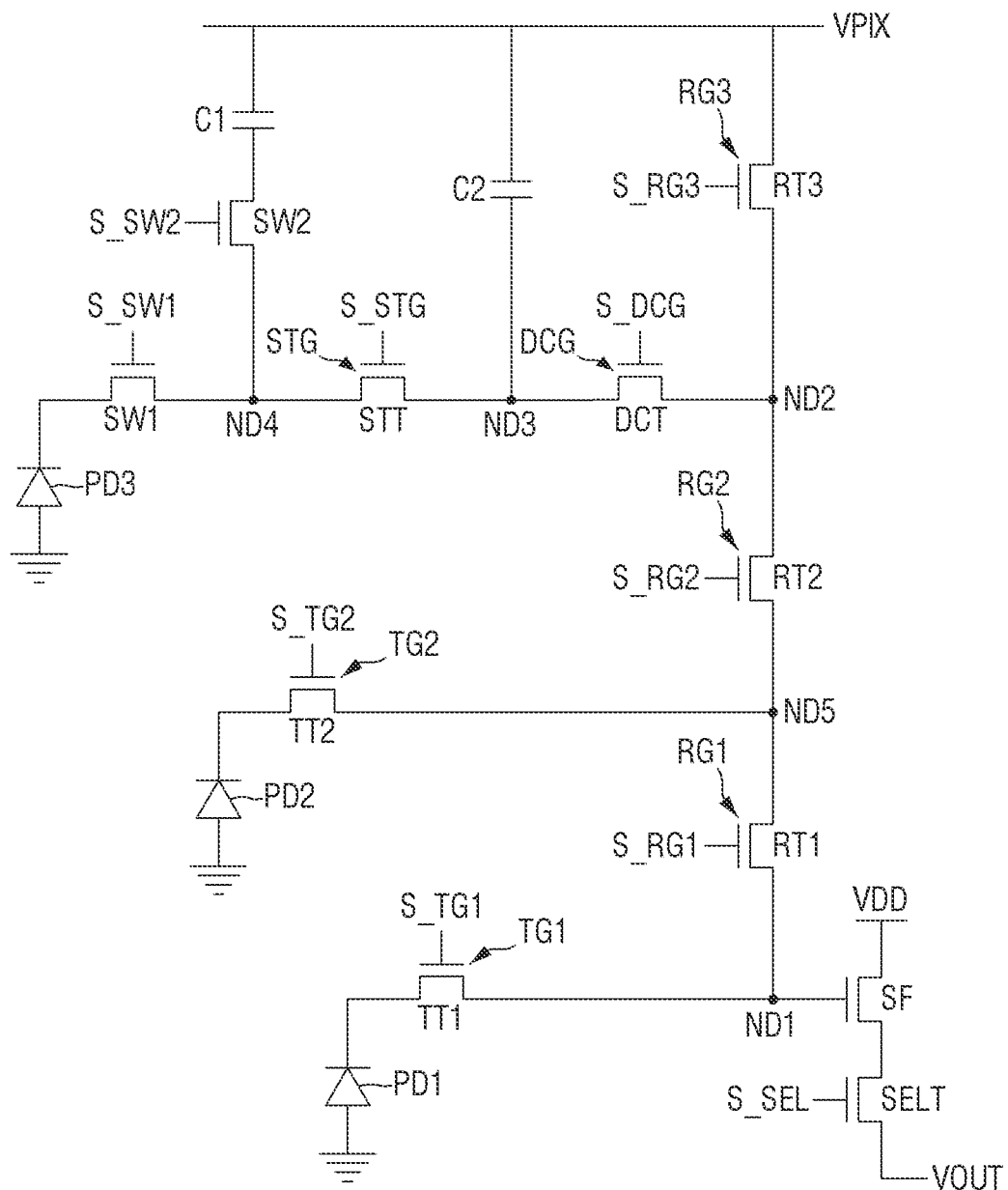
FIG. 17 is a circuit diagram of a unit pixel according to some embodiments of the present disclosure.

FIG. 17 is a circuit diagram of a unit pixel according to some embodiments of the present disclosure.

Referring to FIG. 17, the unit pixel may include a first photodiode PD1, a first transfer transistor TT1, a first reset transistor RT1, a source follower SF, a select transistor SELT, a second photodiode PD2, a second transfer transistor TT2, a second reset transistor RT2, a third photodiode PD3, a third transfer transistor STT, a third reset transistor RT3, a dual conversion transistor DCT, a first switch SW1, a second switch SW2, a first capacitor C1, and a second capacitor C2.

When the unit pixel in FIG. 17 is compared with the unit pixel in FIG. 14, the first photodiode PD1, the first transfer transistor TT1, the first reset transistor RT1, the third photodiode PD3, and the third transfer transistor STT in FIG. 17 may respectively correspond to the large photodiode LPD, the large transfer transistor LTT, the connection transistor DRT, the small photodiode SPD, and the small transfer transistor STT in FIG. 14.

The second photodiode PD2 may act as a photoelectric converter. That is, the second photodiode PD2 may convert light incident to the unit pixel into charges. Further, the second photodiode PD2 may store therein the converted charges. One end of the second photodiode PD2 may be connected to the third voltage, for example, the ground voltage. The second transfer transistor TT2 may be disposed between and connected to the second photodiode PD2 and a fifth node ND5. That is, a source and a drain of the second transfer transistor TT2 may be respectively connected to one end of the second photodiode PD2 and the fifth node ND5. The second transfer transistor TT2 may include a second transfer gate TG2. A second transfer gate signal S_TG2 may be applied to the second transfer gate TG2 to control the second transfer transistor TT2. For example, when the second transfer gate signal S_TG2 is pulled-up, the second transfer transistor TT2 may be turned on such that the charges generated from the second photodiode PD2 may be transferred to the fifth node ND5.

When the number of the photodiodes connected to the unit pixel is increased, the unit pixel may output a signal with a full dynamic range FDR including a wider dynamic range. Therefore, the image sensor 100 may output an image with improved quality under both low illuminance and high illuminance environments.

Hereinafter, with reference to FIG. 18 and FIG. 19, unit pixels according to some embodiments will be described.

Figure 18:
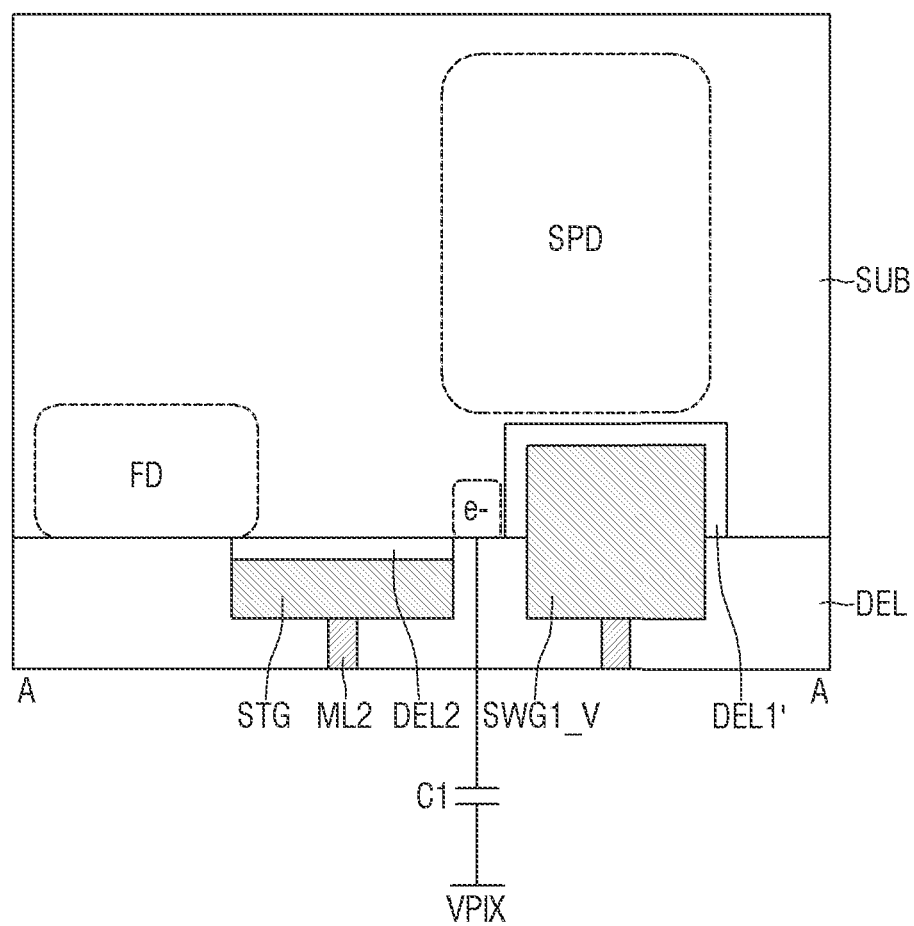
FIG. 18 is a cross-sectional view of a unit pixel according to some embodiments of the present disclosure.

FIG. 18 is a cross-sectional view of a unit pixel according to some embodiments of the present disclosure. FIG. 19 is a cross-sectional view of a unit pixel according to some embodiments of the present disclosure. For convenience of description, components duplicate with those as described above are briefly described or descriptions thereof are omitted.

Referring to FIG. 18, the unit pixel may include a first vertical switch gate SWG1_V and a first insulating layer DEL1'. The first insulating layer DEL1' may be formed along a trench in the substrate SUB. The first insulating layer DEL1' may be formed at a boundary between the substrate SUB and the first vertical switch gate SWG1_V. The first vertical switch gate SWG1_V may be formed in both the substrate SUB and the insulating layer DEL. That is, the first vertical switch gate SWG1_V may be formed in a trench formed in the first insulating layer DELP. The first vertical switch gate SWG1_V may be adjacent to the small photodiode SPD. Therefore, the first vertical switch gate SWG1_V may perform on/off operations using a smaller voltage, thereby reducing power consumption of the unit pixel.

Figure 19:
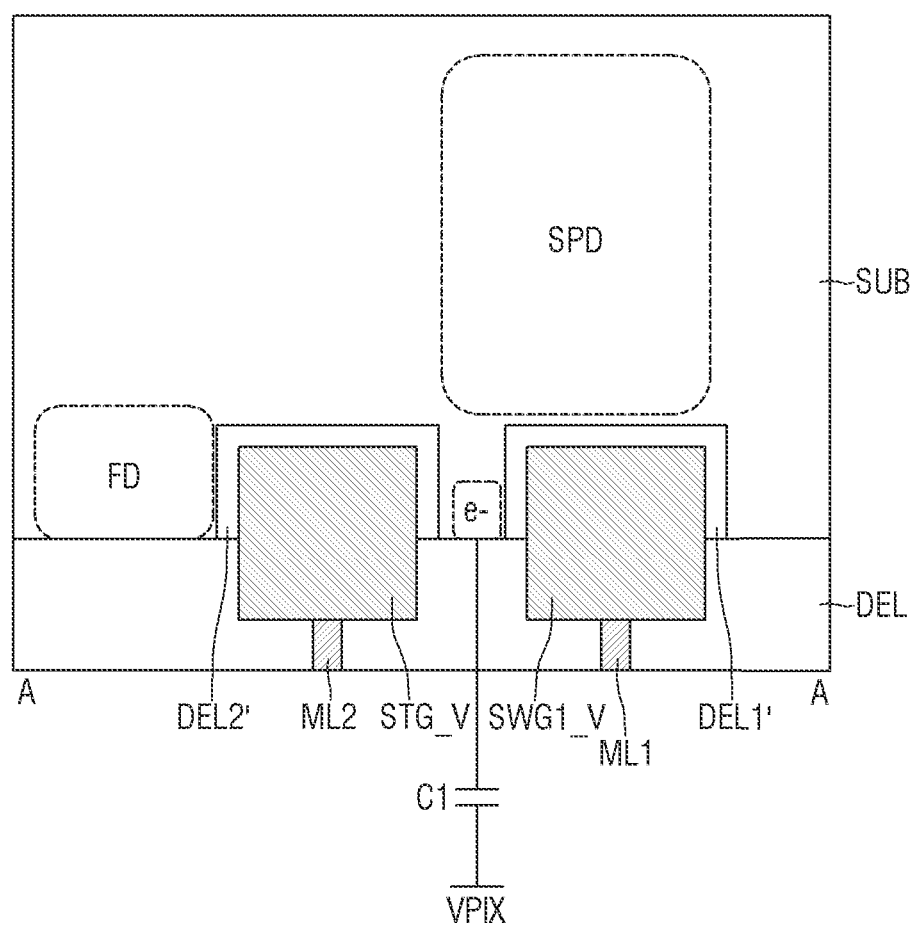
FIG. 19 is a cross-sectional view of a unit pixel according to some embodiments of the present disclosure.

Referring to FIG. 19, the unit pixel may include a vertical small transfer gate STG V and a second insulating layer DEL2'. In this case, the second insulating layer DEL2' may be formed along a trench in the substrate SUB. That is, the second insulating layer DEL2' may be formed at a boundary between the vertical small transfer gate STG V and the substrate SUB. The vertical small transfer gate STG V may be formed in both the substrate SUB and the insulating layer DEL. That is, the vertical small transfer gate STG V may be formed in a trench formed in the second insulating layer DEL2'. In this case, the vertical small transfer gate STG V may be closer to the small photodiode SPD. Therefore, the vertical small transfer gate STG V may perform on/off operations using a smaller voltage, thereby reducing the power consumption of the unit pixel.

Hereinafter, with reference to FIG. 20, a unit pixel according to still another embodiments of the present disclosure will be described. For convenience of description, components duplicate with those as described above are briefly described or descriptions thereof are omitted.

Figure 20:
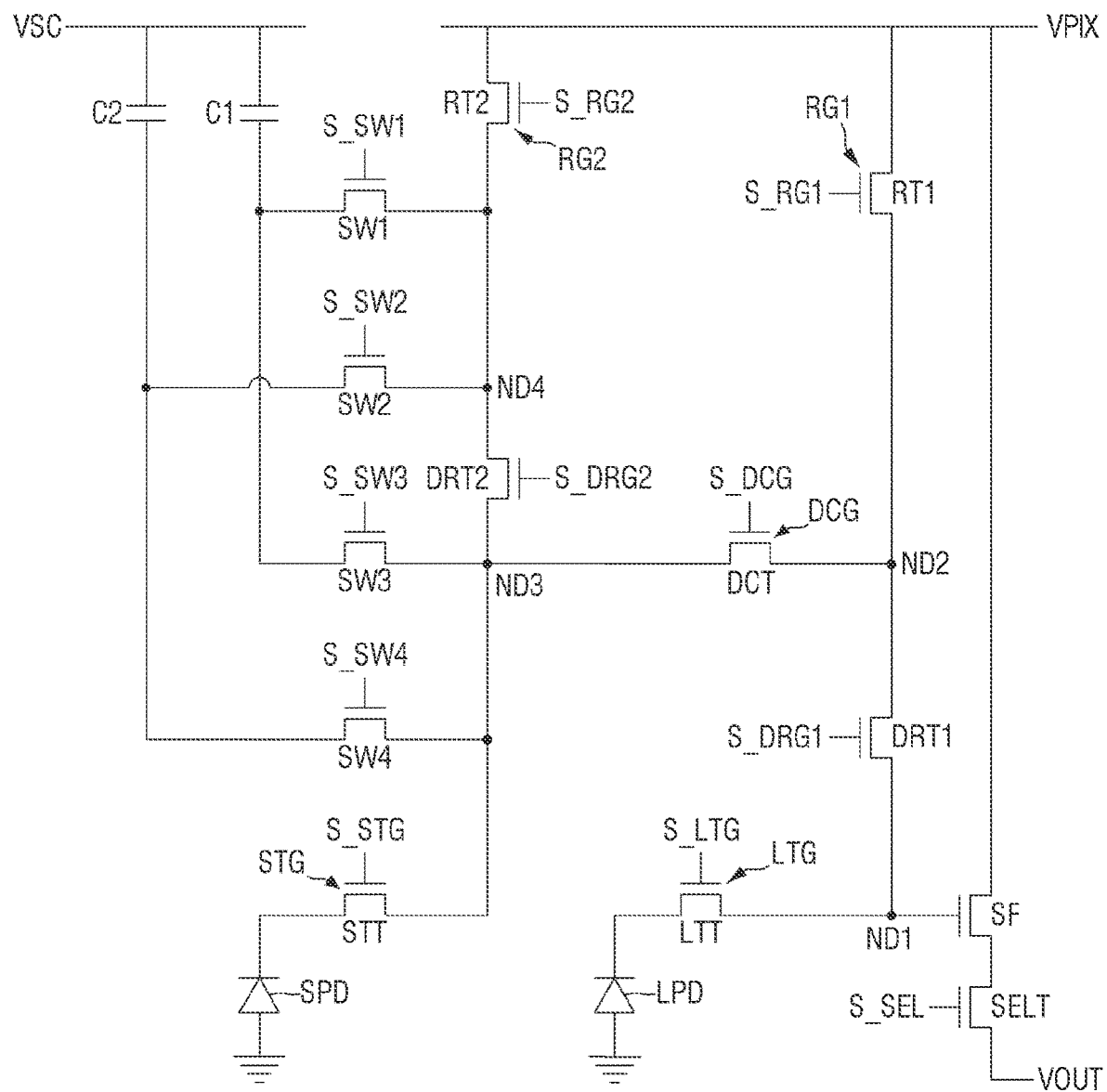
FIG. 20 is a circuit diagram of a unit pixel according to some embodiments of the present disclosure.

Referring to FIG. 20, the unit pixel may include a large photodiode LPD, a large transfer transistor LTT, a source follower SF, a select transistor SELT, a first connection transistor DRT1, a first reset transistor RT1, a second connection transistor DRT2, a second reset transistor RT2, a dual conversion transistor DCT, a first switch SW1, a second switch SW2, a third switch SW3, a fourth switch SW4, a first capacitor C1, a second capacitor C2, a small photodiode SPD, and a small transfer transistor STT. In this case, the large photodiode LPD, the large transfer transistor LTT, the source follower SF, the select transistor SELT, the first connection transistor DRT1, the first reset transistor RT1, the dual conversion transistor DCT, the small photodiode SPD and the small transfer transistor STT, the first capacitor C1, and the second capacitor C2 may correspond to those in the unit pixel as described above using FIG. 1 to FIG. 19.

The first capacitor C1 and the second capacitor C2 may be connected to a fourth voltage VSC. The fourth voltage VSC may be lower than the second voltage VPIX. However, this is an example. Embodiments according to the technical idea of the present disclosure are not limited thereto. For example, the fourth voltage VSC may be equal to the second voltage VPIX.

The second connection transistor DRT2 may be disposed between and connected to the third node ND3 and the fourth node ND4. That is, a source and a drain of the second connection transistor DRT2 may be respectively connected to the third node ND3 and the fourth node ND4. The second connection transistor DRT2 may connect the third node ND3 to the fourth node ND4 when a second connection gate signal S DRG1 is pulled-up.

The second reset transistor RT2 may include a source and a drain respectively connected to the fourth node ND4 and the second voltage VPIX. The second reset transistor RT2 may include a second reset gate RG2 to which a second reset gate signal S_RG2 is applied. The second reset transistor RT2 may connect the fourth node ND4 to the second voltage VPIX when the second reset gate signal S_RG2 is pulled-up, thereby resetting the first capacitor C1 and the second capacitor C2.

The first switch SW1 may be disposed between and connected to the first capacitor C1 and the fourth node ND4. That is, a source and a drain of the first switch SW1 may be respectively connected to the first capacitor C1 and the fourth node ND4. A first switch signal S_SW1 may be applied to a first switch gate to control the first switch SW1. For example, when the first switch signal S_SW1 is pulled-up, the first switch SW1 may be turned on, such that the charges generated from the small photodiode SPD may be transferred to the first capacitor C1.

The second switch SW2 may be disposed between and connected to the second capacitor C2 and the fourth node ND4. That is, a source and a drain of the second switch SW2 may be respectively connected to the second capacitor C2 and the fourth node ND4. A second switch signal S_SW2 may be applied to a second switch gate to control the second switch SW2. For example, when the second switch signal S_SW2 is pulled-up, the second switch SW2 may be turned on such that the charges generated from the small photodiode SPD may be transferred to the second capacitor C2.

The third switch SW3 may be disposed between and connected to the first capacitor C1 and the third node ND3. That is, a source and a drain of the third switch SW3 may be respectively connected to the first capacitor C1 and the third node ND3. A third switch signal S_SW3 may be applied to a third switch gate to control the third switch SW3. For example, when the third switch signal S_SW3 is pulled-up, the third switch SW3 may be turned on such that the charges generated from the small photodiode SPD may be transferred to the first capacitor C1.

The fourth switch SW4 may be disposed between and connected to the second capacitor C2 and the third node ND3. That is, a source and a drain of the fourth switch SW4 may be respectively connected to the second capacitor C2 and the third node ND3. A fourth switch signal S_SW4 may be applied to a fourth switch gate to control the fourth switch SW4. For example, when the fourth switch signal S_SW4 is pulled-up, the fourth switch SW4 may be turned on such that the charges generated from the small photodiode SPD may be transferred to the second capacitor C2.

An area of the unit pixel where the small photodiode SPD is disposed may have a smaller size than that of an area of the unit pixel where the large photodiode LPD is disposed. Therefore, the small photodiode SPD may store therein an insufficient amount of the charges into which the received light is converted. In this case, the first capacitor C1 and the second capacitor C2 may store therein the charges overflowing from the small photodiode SPD, thereby increasing the full well capacity (FWC) of the unit pixel. That is, storing the charges in the first capacitor C1 and the second capacitor C2 may allow the capacitance of the unit pixel UP to be increased. Thus, the full well capacity (FWC) of the unit pixel may be increased. Further, thus, the dynamic range of the signal output from the unit pixel may be increased. In this case, the dynamic range of the unit pixel may be finely adjusted using the first to fourth switches SW1, SW2, SW3, and SW4. That is, controlling the on/off operations of the first to fourth switches SW1, SW2, SW3, and SW4 may allow the capacitances of the third and the fourth nodes ND3 and ND4 to be adjusted.

Hereinafter, a unit pixel according to some embodiments of the present disclosure will be described with reference to FIG. 21. For convenience of description, components duplicate with those as described above are briefly described or descriptions thereof are omitted.

Figure 21:
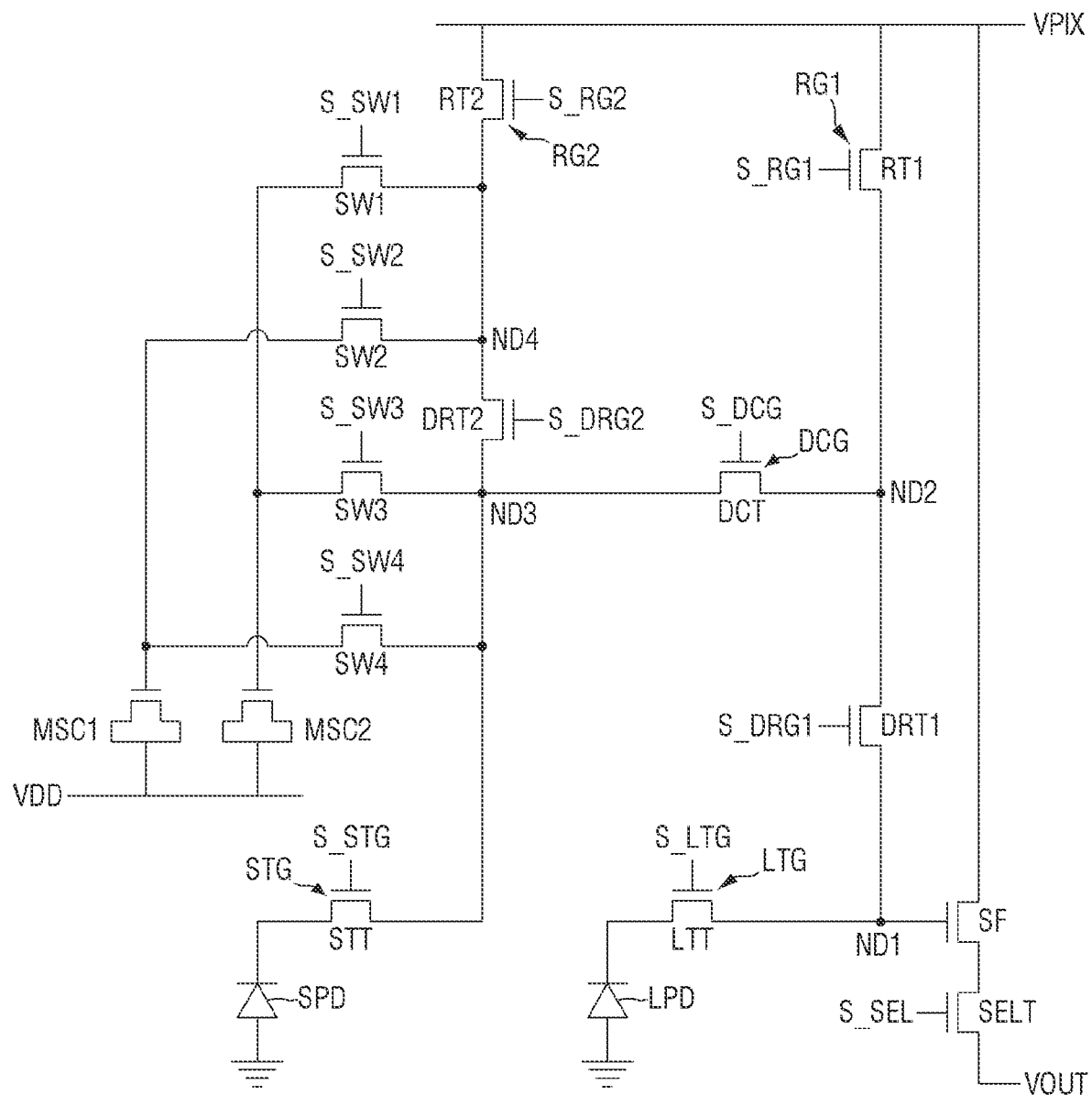
FIG. 21 is a circuit diagram of a unit pixel according to some embodiments of the present disclosure.

FIG. 21 is a circuit diagram of a unit pixel according to some embodiments of the present disclosure.

Referring to FIG. 21, the unit pixel may include a first MOS (metal-oxide-semiconductor) capacitor MSC1 and a second MOS capacitor MSC2. The first MOS capacitor MSC1 and the second MOS capacitor MSC2 may respectively replace the first capacitor C1 and the second capacitor C2 as described with reference to FIG. 20. Each of the first MOS capacitor MSC1 and the second MOS capacitor MSC2 may be connected to and disposed between the first voltage VDD and each of the third node ND3 and the fourth node ND4 and may store therein charges overflowing from the small photodiode SPD.

Hereinafter, a unit pixel according to some embodiments of the present disclosure will be described with reference to FIG. 22. For convenience of description, components duplicate with those as described above are briefly described or descriptions thereof are omitted.

Figure 22:
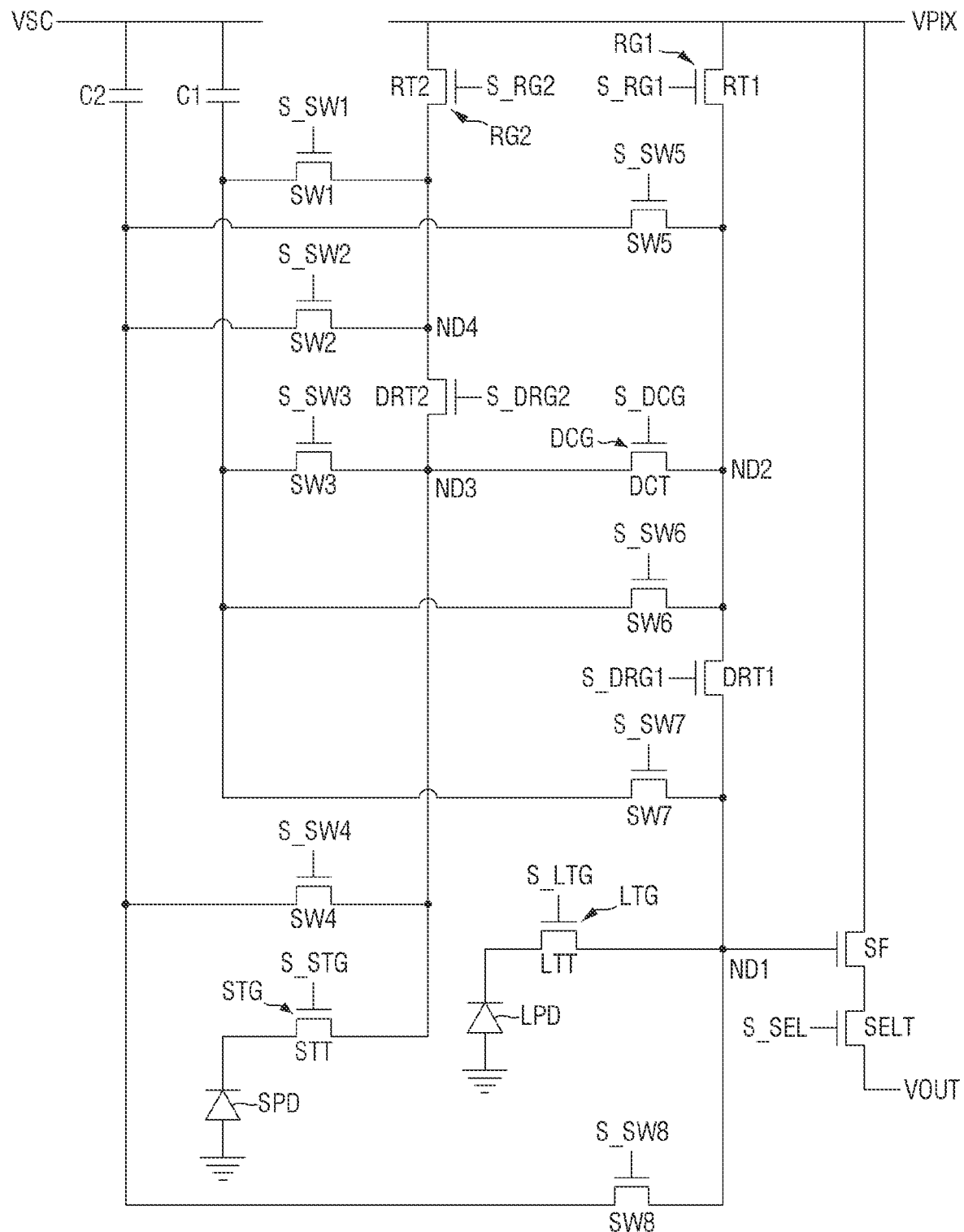
FIG. 22 is a circuit diagram of a unit pixel according to some embodiments of the present disclosure.

FIG. 22 is a circuit diagram of a unit pixel according to some embodiments of the present disclosure.

Referring to FIG. 22, when the unit pixel in FIG. 22 is compared to the unit pixel of FIG. 20, the unit pixel in FIG. 22 may further include a fifth switch SW5, a sixth switch SW6, a seventh switch SW7, and an eighth switch SW8.

The fifth switch SW5 may be disposed between and connected to the second capacitor C2 and the second node ND2. That is, a source and a drain of the fifth switch SW5 may be respectively connected to the second capacitor C2 and the second node ND2. A fifth switch signal S_SW5 may be applied to a fifth switch gate to control the fifth switch SW5.

The sixth switch SW6 may be disposed between and connected to the first capacitor C1 and the second node ND2. That is, a source and a drain of the sixth switch SW6 may be respectively connected to the first capacitor C1 and the second node ND2. A sixth switch signal S_SW6 may be applied to a sixth switch gate to control the sixth switch SW6.

The seventh switch SW7 may be disposed between and connected to the first capacitor C1 and the first node ND1. That is, a source and a drain of the seventh switch SW7 may be respectively connected to the first capacitor C1 and the first node ND1. A seventh switch signal S_SW7 may be applied to a seventh switch gate to control the seventh switch SW7.

The eighth switch SW8 may be disposed between and connected to the second capacitor C2 and the first node ND1. That is, a source and a drain of the eighth switch SW8 may be respectively connected to the second capacitor C2 and the first node ND1. An eighth switch signal S_SW8 is applied to an eighth switch gate to control the eighth switch SW8.

When the unit pixel in FIG. 22 is compared to the unit pixel in FIG. 20, the dynamic range of the unit pixel in FIG. 22 may be controlled relatively more precisely using the fifth switch SW5, the sixth switch SW6, the seventh switch SW7, and the eighth switch SW8. That is, controlling the on/off operations of the fifth switch SW5, the sixth switch SW6, the seventh switch SW7, and the eighth switch SW8 may allow the capacitances of the first to fourth nodes ND1, ND2, ND3, and ND4 to be adjusted.

Hereinafter, a vehicle 700 including an image sensor 730 according to another embodiment will be described with reference to FIG. 23.

Figure 23:
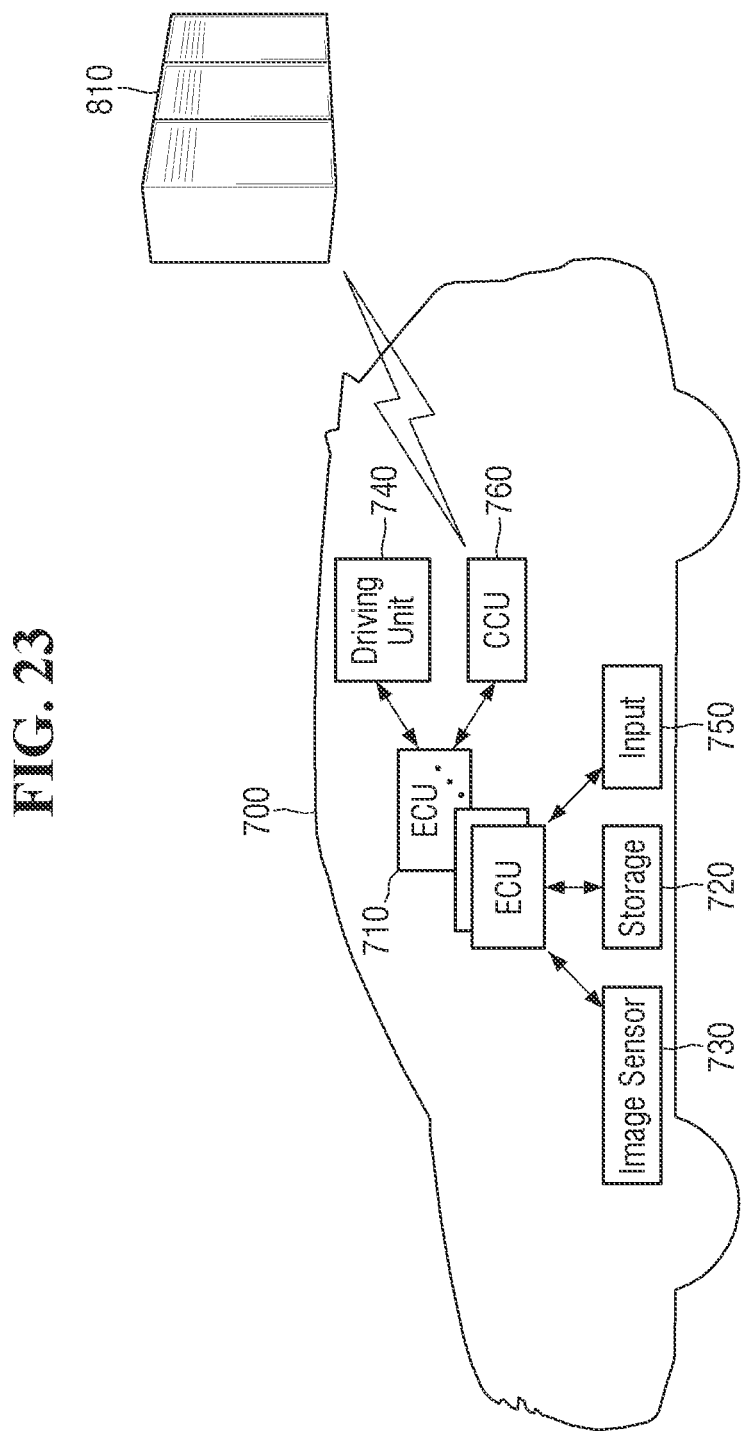
FIG. 23 is a diagram of a vehicle including an image sensor according to some embodiments of the present disclosure.

FIG. 23 is a view of a vehicle including an image sensor according to some embodiments. For convenience of description, components duplicate with those as described above are briefly described or descriptions thereof are omitted.

Referring to FIG. 23, the vehicle 700 may include a plurality of electronic control units (ECUs) 710, and a storage device 720.

Each of the plurality of electronic control units 710 may be electrically, mechanically, and communicatively connected to at least one device among a plurality of devices provided in the vehicle 700 and may control an operation of the at least one device based on one function execution command.

In this case, the plurality of devices may include the image sensor 730 that acquires information required to perform at least one function, and a driving unit 740 that performs at least one function.

For example, the image sensor 730 may include the image sensor 100 as described above with reference to FIG. 1 to FIG. 22. The image sensor 730 may include the image sensor 100 including the unit pixel UP as described above. In this case, the image sensor 730 may be embodied as an automotive image sensor.

The driving unit 740 may include a fan and a compressor of an air conditioning device, a fan of a ventilation device, an engine and a motor of a power device, a motor of a steering device, a motor and a valve of a braking device, and an opening/closing device of a door or a tail gate.

The plurality of electronic control units 710 may communicate with the image sensor 730 and the driving unit 740 using, for example, at least one of Ethernet, low voltage differential signal (LVDS) communication, and LIN (Local Interconnect Network) communication.

The plurality of electronic control units 710 determines whether it is necessary to perform a function, based on information obtained through the image sensor 730, and then, controls an operation of the driving unit 740 that performs the function when it is determined that it is necessary to perform the function. In this case, the plurality of electronic control units 710 may control an operation amount based on the obtained information. In this case, the plurality of electronic control units 710 may store the acquired image in the storage 720 or read information stored in the storage 720 and use the read information.

The plurality of electronic control units 710 may control an operation of the driving unit 740 that performs the function, based on the function execution command input through an input unit 750. The plurality of electronic control units 710 may identify a set amount corresponding to information input through the input unit 750, and may control the operation of the driving unit 740 which performs the function, based on the identified set amount Each electronic control unit 710 may independently control one function, or may control one function in conjunction with another electronic control unit.

For example, an electronic control unit for a collision avoidance device may output a warning sound about collision with an obstacle through a speaker when a distance of the vehicle to the obstacle as detected using a distance detector is within a reference distance.

An electronic control unit for an autonomous driving control device may be associated with an electronic control unit for a vehicle terminal, an electronic control unit for an image sensor, and an electronic control unit for the collision avoidance device and may receive navigation information, road image information, and distance information to the obstacles, and may control the power device, the braking device, and the steering device based on the received information for autonomous driving.

A connectivity control unit (CCU) 760 may be electrically, mechanically and communicatively connected to each of the plurality of electronic control units 710, and may communicate with each of the plurality of electronic control units 710.

That is, the connectivity control device 760 may communicate directly with the plurality of electronic control units 710 provided inside the vehicle, and may communicate with an external server, and may communicate with an external terminal via an interface.

In this case, the connectivity control device 760 may communicate with the plurality of electronic control units 710, and may communicate with a server 810 using an antenna (not shown) and RF communication.

Further, the connectivity control device 760 may communicate with the server 810 through wireless communication. In this case, the wireless communication between the connectivity control device 760 and the server 810 may include various wireless communication schemes such as WiFi, wireless broadband, GSM (global System for Mobile Communication), CDMA (Code Division Multiple Access), WCDMA (Wideband Code Division Multiple Access), UMTS (universal mobile telecommunications system), TDMA (Time Division Multiple Access), LTE (Long Term Evolution), etc.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An image sensor comprising:
   a pixel array including a plurality of unit pixels,
   wherein each of the unit pixels comprises:
   a first photoelectric converter configured to convert received light into charges;
   a first transfer transistor electrically connected between the first photoelectric converter and a first node;
   a connection transistor electrically connected between a second node and the first node;
   a dual conversion transistor electrically connected between a third node and the second node;
   a reset transistor electrically connected between a pixel voltage node and the second node;
   a second transfer transistor electrically connected between a fourth node and the third node;
   a second photoelectric converter electrically connected to the fourth node and configured to convert the received light into charges;
   a first switch electrically connected between the second photoelectric converter and the fourth node;
   a first capacitor electrically connected to the fourth node and the pixel voltage node, wherein the first capacitor is configured to store charges that overflow from the second photoelectric converter; and
   a second capacitor electrically connected to the third node and the pixel voltage node, wherein the second capacitor is configured to store charges that overflow from the second photoelectric converter,
   wherein the first switch is configured to be turned on after the second transfer transistor is turned on and the first, second, third, and fourth nodes are reset by the reset transistor.

2. The image sensor of claim 1, wherein the image sensor further comprises a second switch electrically connected between the fourth node and the first capacitor.

3. The image sensor of claim 1, wherein the image sensor further comprises a third switch electrically connected between the third node and the second capacitor.

4. The image sensor of claim 3, wherein the image sensor further comprises:
a third capacitor connected to the third node, wherein the third capacitor is configured to store charges that overflow from the second photoelectric converter; and
a fourth switch electrically connected between the third node and the third capacitor.

5. The image sensor of claim 1, wherein the image sensor further comprises:
a third photoelectric converter configured to convert the received light into charges; and
a third transfer transistor electrically connected between a fifth node and the third photoelectric converter.

6. The image sensor of claim 1,
wherein each of the unit pixels further comprises a substrate having the first photoelectric converter and the second photoelectric converter embedded therein, wherein a gate of the first switch is in the substrate.

7. The image sensor of claim 6,
wherein a gate of the second transfer transistor is in the substrate.

8. The image sensor of claim 1, wherein the image sensor is configured to perform a correlated double sampling operation on the second photoelectric converter to reduce noise of an output image of the image sensor.

9. A unit pixel comprising:
a first photoelectric converter configured to convert received light into charges;
a first transfer transistor electrically connected between the first photoelectric converter and a first node;
a connection transistor electrically connected between a second node and the first node;
a dual conversion transistor electrically connected between a third node and the second node;
a second transfer transistor electrically connected between a fourth node and the third node;
a second photoelectric converter that is electrically connected to the fourth node and configured to convert the received light into charges;
a first switch electrically connected between the second photoelectric converter and the fourth node;
a first capacitor that is electrically connected to the fourth node, wherein the first capacitor is configured to store charges that overflow from the second photoelectric converter; and
a second capacitor that is electrically connected to the third node, wherein the second capacitor is configured to store charges that overflow from the second photoelectric converter,
wherein the unit pixel is configured to perform operations comprising:
converting the charges accumulated in the first photoelectric converter into a first signal voltage, and outputting the first signal voltage for a first time period;
converting the charges accumulated in the first photoelectric converter into a second signal voltage, and outputting the second signal voltage for a second time period subsequent to the first time period; and
converting the charges accumulated in the first photoelectric converter, the first capacitor, and the second capacitor into a third signal voltage, and outputting the third signal voltage for a third time period subsequent to the second time period.

10. The unit pixel of claim 9, wherein the unit pixel is configured to convert the charges accumulated in the first photoelectric converter, the second photoelectric converter, the first capacitor, and the second capacitor into a fourth signal voltage, and output the fourth signal voltage for a fourth time period that is between the second time period and the third time period.

11. The unit pixel of claim 9, wherein the first switch is configured to be always turned on.

12. The unit pixel of claim 9, wherein the unit pixel further comprises a second switch electrically connected between the fourth node and the first capacitor.

13. The unit pixel of claim 9,
wherein the unit pixel further comprises a substrate having the first photoelectric converter and the second photoelectric converter embedded therein, and
wherein a gate of the first switch is in the substrate.

14. The unit pixel of claim 13, wherein a gate of the second transfer transistor is in the substrate.

15. A unit pixel comprising:
a first photoelectric converter configured to convert received light into charges;
a first transfer transistor electrically connected between the first photoelectric converter and a first node;
a first connection transistor electrically connected between a second node and the first node;
a dual conversion transistor electrically connected between a third node and the second node;
a second connection transistor electrically connected between a fourth node and the third node;
a second photoelectric converter electrically connected to the third node and configured to convert the received light into charges;
a second transfer transistor electrically connected to the second photoelectric converter and the third node;
a first capacitor configured to store charges that overflow from the second photoelectric converter;
a second capacitor physically separated from the first capacitor, wherein the second capacitor is configured to store charges that overflow from the second photoelectric converter;
a first switch configured to selectively electrically connect the first capacitor to the fourth node;
a second switch configured to selectively electrically connect the second capacitor to the fourth node;
a third switch configured to selectively electrically connect the first capacitor to the third node; and
a fourth switch configured to selectively electrically connect the second capacitor to the third node,
wherein a first voltage is configured to be applied to the first node, the second node, the third node, and the fourth node,
wherein a second voltage different from the first voltage is configured to be applied to the first capacitor and the second capacitor.

16. The unit pixel of claim 15, wherein the first capacitor comprises a first MOS capacitor.

17. The unit pixel of claim 16, wherein the second capacitor comprises a second MOS capacitor.

18. The unit pixel of claim 15, wherein the unit pixel further comprises:
a fifth switch configured to selectively electrically connect the second capacitor to the second node;
a sixth switch configured to selectively electrically connect the first capacitor to the second node;
a seventh switch configured to selectively electrically connect the first capacitor to the first node; and an eighth switch configured to selectively electrically connect the second capacitor to the first node.

* * * * *